(12) United States Patent
Miyauchi et al.

(10) Patent No.: US 9,724,999 B2
(45) Date of Patent: Aug. 8, 2017

(54) INSULATED POWER SUPPLY APPARATUS WITH UPPER ARM TRANSFORMERS AND A LOWER ARM TRANSFORMER

(71) Applicant: DENSO CORPORATION, Kariya, Aichi-pref. (JP)

(72) Inventors: Syun Miyauchi, Chiryu (JP); Tsuneo Maebara, Nagoya (JP); Yusuke Shindo, Nagoya (JP); Junichi Fukuta, Kuwana (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/495,128

(22) Filed: Sep. 24, 2014

(65) Prior Publication Data

US 2015/0085536 A1    Mar. 26, 2015

(30) Foreign Application Priority Data

Sep. 24, 2013  (JP) .................................. 2013-196833

(51) Int. Cl.
| | |
|---|---|
| *H03K 17/691* | (2006.01) |
| *B60L 11/18* | (2006.01) |
| *B60L 15/00* | (2006.01) |
| *H03K 17/61* | (2006.01) |
| *H02M 7/00* | (2006.01) |

(52) U.S. Cl.
CPC ....... *B60L 11/1803* (2013.01); *B60L 11/1864* (2013.01); *B60L 15/007* (2013.01);
(Continued)

(58) Field of Classification Search
CPC ................ H04L 25/026; H03K 19/003; H03K 19/00307; H03K 19/00315;
(Continued)

(56) References Cited

U.S. PATENT DOCUMENTS

| 4,754,385 | A | * | 6/1988 | McDade | ............. H02M 3/3353 363/16 |
| 2007/0171689 | A1 | * | 7/2007 | Ishikawa | ............... B60L 11/123 363/71 |

(Continued)

FOREIGN PATENT DOCUMENTS

| JP | 11-178356 | 7/1999 |
| JP | 2012-120304 | 6/2012 |

*Primary Examiner* — Harry Behm
*Assistant Examiner* — Bryan R Perez
(74) *Attorney, Agent, or Firm* — Nixon & Vanderhye P.C.

(57) ABSTRACT

Upper arm connection sections and lower arm connection sections are provided in parallel. An upper arm transformer and a power supply are provided in an area opposed to the lower arm connection sections with respect to the upper arm connection sections. A power supply control section is provided in at least one of an area opposed to the upper arm connection sections with respect to the upper arm transformer, and an area which is sandwiched between at least one of the upper and lower connection sections closest to one side of the substrate positioned in a direction in which the upper arm connection sections are arranged, and the one side. The lower arm transformer is provided in an area opposed to the upper arm connection sections with respect to the lower arm connection sections. The lower arm transformer is common to at least two of the lower arm switching elements.

6 Claims, 11 Drawing Sheets

(52) U.S. Cl.
CPC ........... *H03K 17/61* (2013.01); *H03K 17/691* (2013.01); *H02M 7/003* (2013.01); *Y02T 10/645* (2013.01); *Y02T 10/7005* (2013.01); *Y02T 10/7061* (2013.01)

(58) Field of Classification Search
CPC ....... H03K 19/00346; H03K 19/00353; H03K 19/00361; H03K 17/10; H03K 17/102; H03K 17/107; H03K 17/12; H03K 17/122; H03K 17/127; H03K 17/161; H03K 17/302; H03K 17/56; H03K 17/601; H03K 17/64; H03K 17/691; H03K 17/731; H03K 17/16; H03K 17/30; H03K 17/567; H03K 17/60; H03K 17/687; H03K 17/6871; H03K 17/61; H03K 17/06
USPC ..... 363/40, 41, 55, 56.01, 56.02, 65, 71, 72; 327/108–110
See application file for complete search history.

(56) References Cited

U.S. PATENT DOCUMENTS

| | | | |
|---|---|---|---|
| 2009/0147544 A1* | 6/2009 | Melanson | H03K 17/691 363/21.01 |
| 2011/0012542 A1* | 1/2011 | Inamura | H02M 1/08 318/139 |
| 2011/0058400 A1* | 3/2011 | Fukuta | H02M 1/084 363/131 |
| 2011/0188271 A1* | 8/2011 | Shinotsuka | H02M 3/335 363/21.15 |
| 2012/0134181 A1 | 5/2012 | Amano et al. | |

* cited by examiner

US 9,724,999 B2

INSULATED POWER SUPPLY APPARATUS WITH UPPER ARM TRANSFORMERS AND A LOWER ARM TRANSFORMER

CROSS-REFERENCE TO RELATED APPLICATION

This application is based on and claims the benefit of priority from earlier Japanese Patent Application No. 2013-196833 filed Sep. 24, 2013, the description of which is incorporated herein by reference.

BACKGROUND

Technical Field

The present invention relates to an insulated power supply apparatus applied to a power converter circuit including a series connection of an upper arm switching element and a lower arm switching element. The apparatus includes an upper arm transformer, which can supply drive voltage from a DC power supply to the upper arm switching element, and a lower arm transformer, which can supply drive voltage from the DC power supply to the lower arm switching element.

Related Art

This type of insulated power supply apparatus is disclosed in JP-A-11-178356. Specifically, the power supply apparatus includes a plurality of transformers, a transistor which conducts or intercepts electricity between primary side coils configuring the transformers and a DC power supply, and a control circuit which controls the transistor.

SUMMARY

An embodiment provides an insulated power supply apparatus which can appropriately suppress radiation noise.

As an aspect of the embodiment, an insulated power supply apparatus is provided, which is applied to at least one power converter circuit including at least one series connection of an upper arm switching element and a lower arm switching element. The power converter circuit includes a parallel connection of the series connection. The apparatus includes: at least one upper arm transformers which has a primary side coil connectable to a DC power supply and a secondary side coil which supplies drive voltage to the upper arm switching element, and which is provided on a substrate; a lower arm transformer which has a primary side coil connectable to the DC power supply and a secondary side coil which supplies drive voltage to the lower arm switching element, and which is provided on the substrate; at least one power supply control section which has at least one voltage control switching element which is turned on or off to apply voltage of the DC power supply to the primary side coils of the upper arm transformer and the lower arm transformer, and an integrated circuit which turns on or off the voltage control switching element, and which is provided on the substrate; a wiring pattern which is mounted on the substrate and connects the primary side coil configuring the lower arm transformer and the DC power supply; a plurality of upper arm connection sections which connect the upper arm switching elements to the substrate and which are provided on the substrate so as to be arranged in line, when viewing a surface of the substrate from a front thereof; and a plurality of lower arm connection sections which connect the lower arm switching elements to the substrate and which are provided on the substrate so as to be arranged in line and in a direction in which the upper arm connection sections are arranged, when viewing the surface of the substrate from the front thereof. The voltage control switching element is provided so as to form a closed circuit including the DC power supply, the primary side coils configuring the upper arm transformer and the lower arm transformer, the wiring pattern, and the voltage control switching element when being turned on. The upper arm connection sections arranged in line and the lower arm connection sections arranged in line are provided in parallel, when viewing the surface of the substrate from the front thereof. The upper arm transformer and the DC power supply are provided in an area opposed to the lower arm connection sections with respect to the upper arm connection sections, when viewing the surface of the substrate from the front thereof. When viewing the surface of the substrate from the front thereof, the power supply control section is provided in at least one of an area opposed to the upper arm connection sections with respect to the upper arm transformer, and an area which is sandwiched between at least one of the upper and lower connection sections closest to one side of the substrate positioned in a direction in which the upper arm connection sections are arranged, and the one side. The lower arm transformer is provided in an area opposed to the upper arm connection sections with respect to the lower arm connection sections, when viewing the surface of the substrate from the front thereof. The lower arm transformer is common to at least two of the lower arm switching elements.

DETAILED DESCRIPTION OF THE PREFERRED EMBODIMENTS

Figure 1:
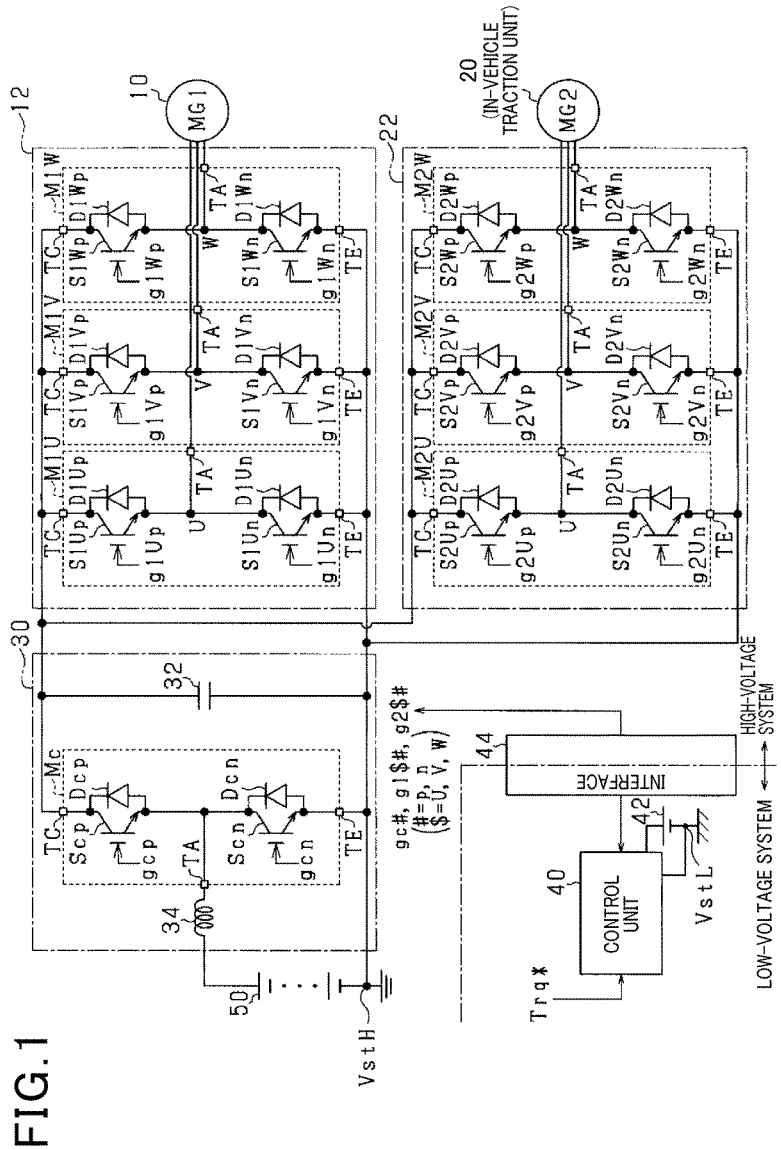
FIG. 1 is a diagram showing a general configuration of a motor control system according to a first embodiment.

With reference to the accompanying drawings, hereinafter are described embodiments of the present invention.

Electronic components such as a plurality of transformers and a control circuit configuring an insulated power supply apparatus are provided on a substrate. First, an insulated power supply apparatus employing the following technique for arranging electronic components is considered.

Specifically, a plurality of upper arm connection sections and a plurality of lower arm connection sections are provided on a substrate of the insulated power supply apparatus. The upper arm connection sections are provided for connecting a plurality of upper arm switching elements to the substrate. Specifically, when viewing the surface of the substrate from the front thereof, the upper arm connection sections are provided so as to be arranged in line. The lower arm connection sections are provided for connecting the lower arm switching elements to the substrate. Specifically, when viewing the surface of the substrate from the front thereof, the lower arm connection sections are provided so as to be arranged in line and in the direction in which the upper arm connection sections are arranged. When viewing the surface of the substrate from the front thereof, the upper arm connection sections arranged in line and the lower arm connection sections arranged in line are provided in parallel.

Meanwhile, when viewing the surface of the substrate from the front thereof, an upper arm transformer and a DC power supply are provided in an area opposed to the lower arm connection sections with respect to the upper arm connection sections (that is, the upper arm transformer and the DC power supply are provided in an area located with the upper arm connection sections between the area and the lower arm connection sections). In addition, when viewing the surface of the substrate from the front thereof, a control circuit is provided in at least one of an area opposed to the upper arm connection sections with respect to the upper arm transformer, and an area which is sandwiched between at least one of the upper and lower connection sections closest to one side of the substrate in the direction in which the upper arm connection sections are arranged, and the one side. In addition, when viewing the surface of the substrate from the front thereof, a lower arm transformer is provided in an area opposed to the upper arm connection sections with respect to the lower arm connection sections.

If the technique disclosed in JP-A-11-178356 is applied to the above configuration, lower arm transformers are individually provided for the lower arm switching elements. In this case, wiring patterns for connecting the primary side coils configuring the lower arm transformers and the DC power supply are provided on the substrate so as to correspond to the lower arm transformers. Hence, the wiring patterns for connecting the primary side coils and the DC power supply are lengthened, and the number of the wiring patterns increases.

Specifically, according to the above technique for arranging electronic components, the upper and lower arm transformers are provided so as to sandwich the upper arm connection sections and the lower arm connection sections therebetween. Hence, there is a concern that a loop including the wiring patterns, the DC power supply, the transistors, the primary side coils, and the ground of the insulated power supply apparatus becomes larger, and the number of the loops increases. If the loop becomes larger, and the number of the loops increases, radiation noise due to switching of the transistor can increase.

First Embodiment

Hereinafter, the first embodiment is described with reference to drawings. In the first embodiment, an insulated power supply apparatus according to the present invention is applied to a hybrid car including a rotary machine and an engine serving as in-vehicle traction units.

As shown in FIG. 1, a motor control system includes a first motor generator 10, a second motor generator 20, a first inverter 12, a second inverter 22, a step-up converter 30, and a control unit 40. The first motor generator 10 and the second motor generator 20 are connected to drive wheels and an engine, which serves as an in-vehicle traction unit, via a power dividing mechanism (not shown). The first motor generator 10 is connected to the first inverter 12. The first motor generator 10 serves as a starter which applies initial rotation to a crankshaft of the engine, a generator supplying electricity to in-vehicle equipment, and the like. The second motor generator 20 is connected to the second inverter 22 and serves as an in-vehicle traction unit and the like. The first inverter 12 and the second inverter 22 are three-phase inverters and are connected to a high-voltage battery 50 (e.g. a lithium-ion secondary battery or a nickel-hydrogen secondary battery). Note that, in the present embodiment, each of the first inverter 12, the second inverter 22, and the step-up converter 30 corresponds to the "power converter circuit".

The step-up converter 30 includes a capacitor 32, a reactor 34, an upper arm step-up switching element Scp, and a lower arm step-up switching element Scn. Specifically, the step-up switching elements Scp, Scn are connected in series. The series connection of the upper arm step-up switching element Scp and the lower arm step-up switching element Scn is connected to the capacitor 32 in parallel. The connection point of the series connection is connected to a positive electrode terminal of the high-voltage battery 50 via the reactor 34. The step-up converter 30 has a function of turning on (closing) and turning off (opening) the step-up switching elements Scp, Scn to increase the output voltage (e.g. 288 V) of the high-voltage battery 50 with setting an upper limit to a predetermined voltage (e.g. 650 V).

The first inverter 12 includes three series connections of first $-phase upper arm switching element S1$p ($=U, V, W) and first $-phase lower arm switching element S1$n. The second inverter 22 includes three series connections of second $-phase upper arm switching element S2$p and second $-phase lower arm switching element S2$n.

Note that, in the present embodiment, voltage control type semiconductor switching elements are used as the switching elements Sc#, S1$#, S2$# (#=p, n). More specifically, IGBTs are used. In addition, free wheel diodes Dc#, D1$#, D2$# are connected to the switching elements Sc#, S1$#, S2$# in anti-parallel.

In addition, in the present embodiment, each of the upper arm step-up switching element Scp, the first $-phase upper arm switching elements S1$p, and the second $-phase upper arm switching elements S2$p corresponds to "upper arm switching element". In addition, each of the lower arm step-up switching element Scn, the first $-phase lower arm switching elements S1$n, and the second $-phase lower arm switching elements S2$n corresponds to "lower arm switching element".

The upper arm step-up switching element Scp, the free wheel diode Dcp connected to the switching element Scp in anti-parallel, the lower arm step-up switching element Scn, and the free wheel diode Dcn connected to the switching element Scn in anti-parallel are modularized to configure a step-up module Mc.

In addition, the first $-phase upper arm switching element S1$p, the free wheel diode D1$p connected to the switching element S1$p in anti-parallel, the first $-phase lower arm switching element S1$n, and the free wheel diode D1$n connected to the switching element S1$n in anti-parallel are modularized to configure a first $-phase module M1$.

In addition, the second $-phase upper arm switching element S2$p, the free wheel diode D2$p connected to the switching element S2$p in anti-parallel, the second $-phase lower arm switching element S2$n, and the free wheel diode D2$n connected to the switching element S2$n in anti-parallel are modularized to configure a second $-phase module M2$.

Figure 2:
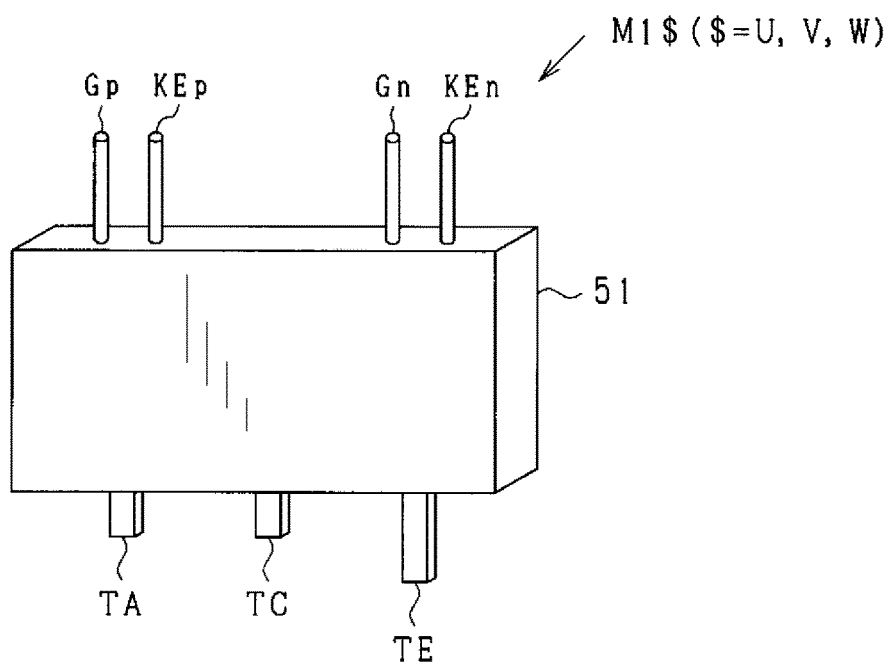
FIG. 2 is a perspective view showing a configuration of a semiconductor module according to the first embodiment.
Figure 3:
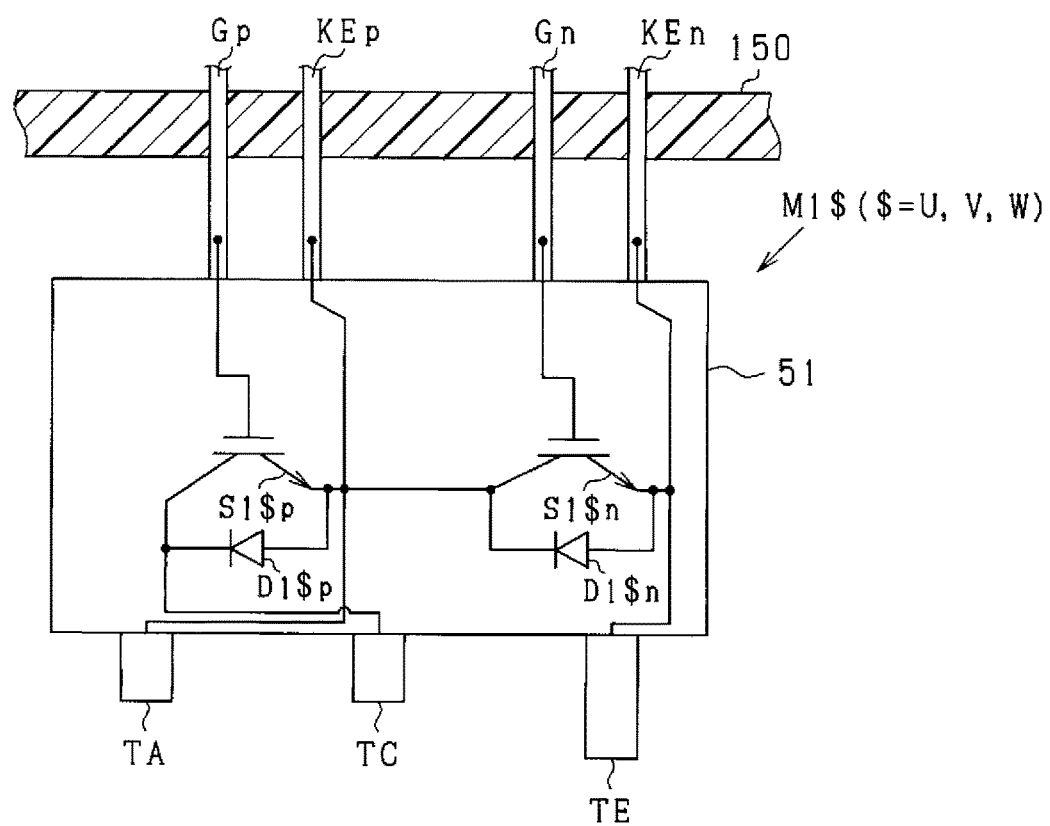
FIG. 3 is a diagram showing an internal configuration of the semiconductor module according to the first embodiment.

Configurations of the above modules are described by taking the first $-phase module M1$ as an example with reference to FIG. 2 and FIG. 3.

The first $-phase module M1$ includes a main body part 51, a plurality of control terminals projecting from the main body part 51, a plurality of power terminals projecting from the main body part 51. The main body part 51 includes the first $-phase upper and lower switching elements S1$p, S1$n and the free wheel diodes D1$p, D1$n. The control terminals include a gate terminal Gp of the first $-phase upper arm switching element S1$p, a Kelvin emitter terminal KEp of the first $-phase upper arm switching element S1$p, a gate terminal Gn of the first $-phase lower arm switching element S1$n, and a Kelvin emitter terminal KEn of the first $-phase lower arm switching element S1$p. The Kelvin emitter terminals KEp, KEn have the same potential as that of the output terminals (emitters) of the switching elements S1$p, S1$n.

In practice, the control terminals include, in addition to the gate terminals Gp, Gn and the Kelvin emitter terminals KEp, KEn, a sensor terminal which outputs a minute current having a correlation with a current (collector current) flowing between the input terminal (collector) and the emitter of the lower arm switching element S1$p, S1$n. Note that, in FIGS. 2 and 3, the sensor terminal and the like are not shown.

The power terminals are a collector terminal TC short-circuited to the collector of the first $-phase upper arm switching element S1$p, an emitter terminal TE short-circuited to the emitter of the first $-phase lower arm switching element S1$n, and a connection terminal TA short-circuited to the connection point of the emitter of the first $-phase upper arm switching element S1$p and the collector of the first $-phase lower arm switching element S1$n.

The main body part 51 has a flattened rectangular parallelepiped shape. The main body part 51 has a pair of surfaces opposed to each other. One of the surfaces is provided with the plurality of control terminals so as to vertically project from the surface. The other of the surfaces is provided with the power terminals so as to vertically project from the surface.

As shown in FIG. 1, the collector terminals TC of the step-up module Mc, the first $-phase module M1$, and the second $-phase module M2$ are connected to each other. The emitter terminals TE of the step-up module Mc, the first $-phase module M1, and the second $-phase module M2$ are connected to a negative terminal of the high-voltage battery 50.

The connection terminal TA of the first $-phase module M1$ is connected to the $-phase of the first motor generator 10. The connection terminal TA of the second $-phase module M2$ is connected to the $-phase of the second motor generator 20. The connection terminal TA of the step-up module Mc is connected to one of two ends of the reactor 34, which is opposed to the other end to which the positive electrode terminal of the high-voltage battery 50 is connected.

The control unit 40 uses a low-voltage battery 42 as a power supply. The control unit 40 is mainly configured by a microcomputer. The control unit 40 operates the first and second inverters 12, 22 and the step-up converter 30 to control controlled variables (torque) of the first and second motor generators 10, 20 to command values (hereinafter, referred to as "command torque Trq*"). Specifically, the control unit 40 generates an operation signal g1$# and outputs the operation signal g1$# to the drive circuit of the switching element S1$# to turn on or off the switching element S1$# configuring the first inverter 12. In addition, the control unit 40 generates an operation signal g2$# and outputs the operation signal g2$# to the drive circuit of the switching element S2$# to turn on or off the switching element S2$# configuring the second inverter 22. Furthermore, the control unit 40 generates an operation signal gc# and outputs the operation signal gc# to the drive circuit to turn on or off the switching element Sc# configuring the step-up converter 30.

Note that, hereinafter, drive circuits driving the upper and lower arm step-up switching elements Scp, Scn are referred to as upper and lower arm step-up drive circuits Drcp, Drcn, drive circuits driving the first $-phase upper and lower arm switching elements S1$p, S1$n are referred to as first $-phase upper and lower arm drive circuits Dr1$p, Dr1$n. Drive circuits driving the second $-phase upper and lower arm switching elements S2$p, S2$n are referred to as second $-phase upper and lower arm drive circuits Dr2$p, Dr2$n.

In addition, in the present embodiment, each of the drive circuits Drcp, Dr1$p, Dr2$p corresponds to an "upper arm drive circuit". Each of the drive circuits Drcn, Dr1$n, Dr2$n corresponds to a "lower arm drive circuit". That is, the upper arm drive circuits are individually provided so as to correspond to upper arm switching elements. The lower arm drive circuits are individually provided so as to correspond to lower arm switching elements.

Note that upper arm operation signals gcp, g1$p, g2$p and lower arm operation signals gcn, g1$n, g2$n corresponding thereto are complementary to each other. That is, the upper arm switching elements Scp, S1$p, S2$p and the lower arm switching elements Scn, S1$n, S2$n corresponding thereto are alternately turned on.

The low-voltage battery 42 (also referred to as auxiliary unit battery) is a storage battery (e.g. lead-acid battery) whose output voltage is lower than that of the high-voltage battery 50.

An interface 44 has a function of transmitting signals between a high-voltage system and a low-voltage system while providing electrical isolation therebetween. The high-voltage system includes the high-voltage battery 50, the first and second inverters 12, 22, the step-up converter 30, and the first and second motor generators 10, 20. The low-voltage system includes the low-voltage battery 42 and the control unit 40. In the present embodiment, the interface 44 includes an insulation photonic element (photocoupler). Note that, in the present embodiment, a reference potential VstL of the low-voltage system and a reference potential VstH of the high-voltage system are different from each other. Specifically, in the present embodiment, the reference potential VstH of the high-voltage system is set to a potential of the negative electrode of the high-voltage battery 50. The reference potential VstL of the low-voltage system is set to a potential of the body of the vehicle which is a median between the potential of the positive electrode terminal and the potential of the negative electrode terminal of the high-voltage battery 50.

Figure 4:
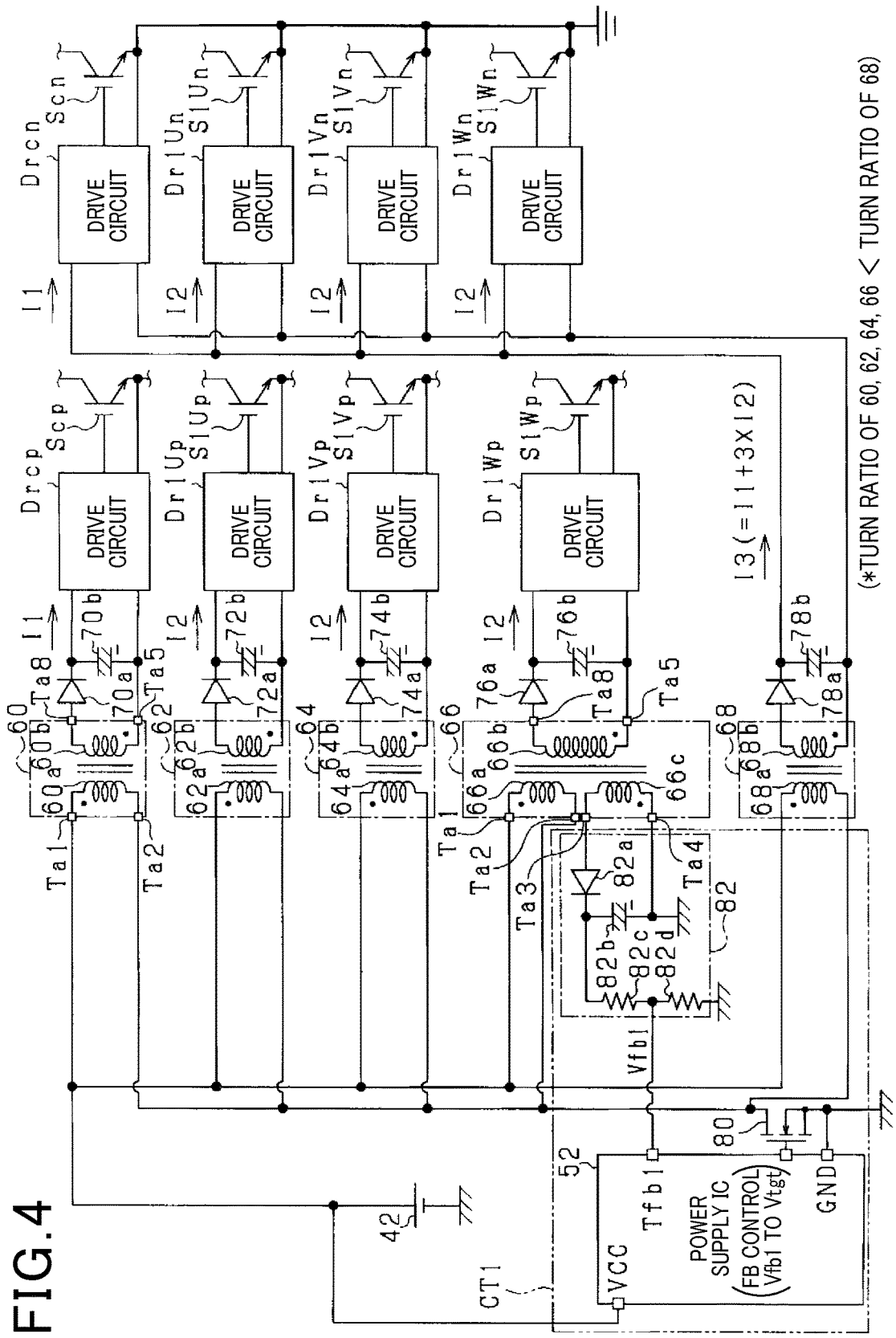
FIG. 4 is a diagram showing an insulated power supply apparatus according to the first embodiment.
Figure 5:
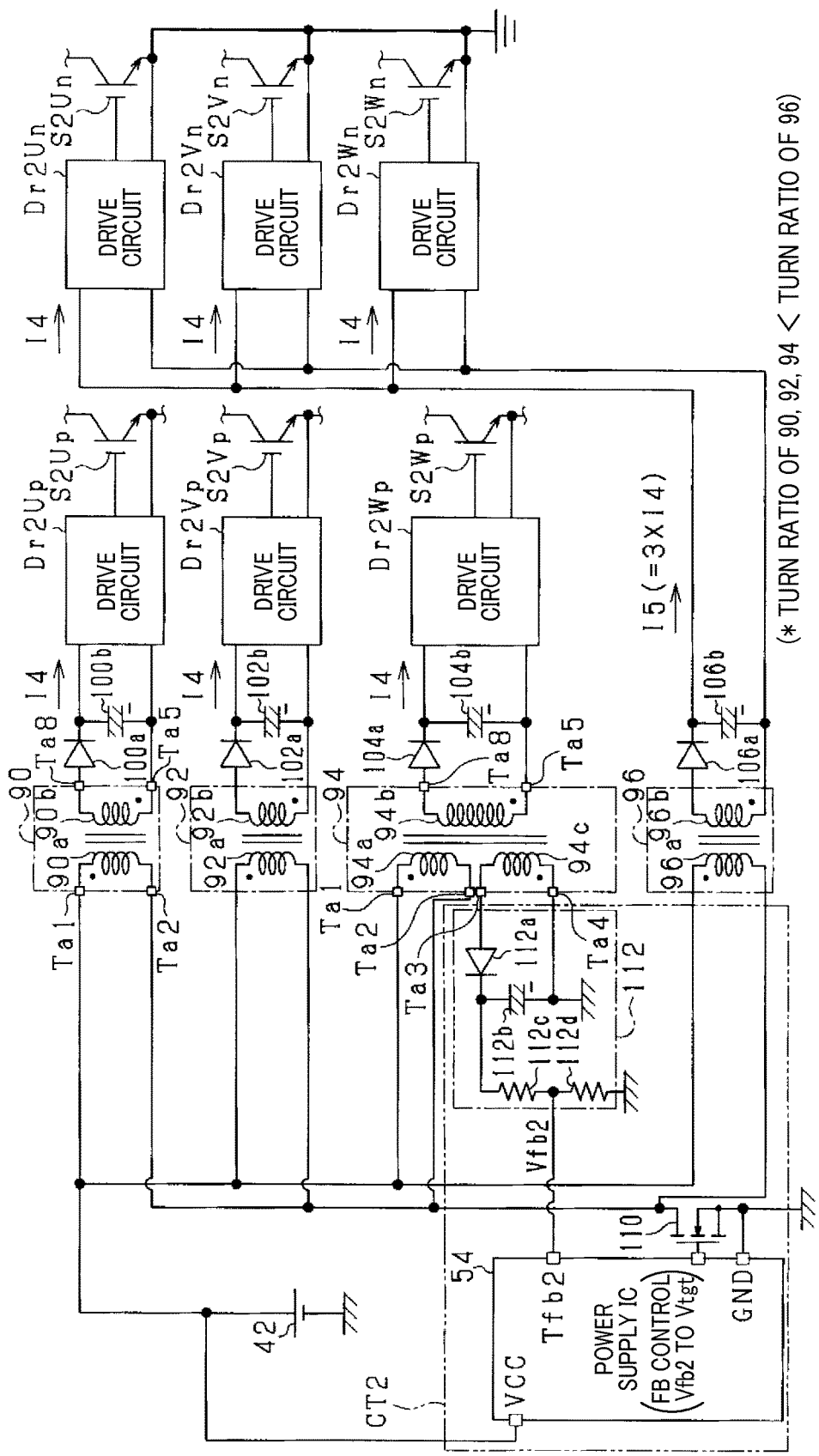
FIG. 5 is a diagram showing an insulated power supply apparatus according to the first embodiment.

Next, with reference to FIGS. 4 and 5, the insulated power supply apparatus is described which supplied drive voltage to drive circuits Drc#, Dr1$#, Dr2$# which drive the switching elements Sc#, S1$#, S2$#, respectively.

In the present embodiment, the first inverter 12, the second inverter 22, and the step-up converter 30 are divided into a group of the first inverter 12 and the step-up converter 30, and the second inverter 22. In addition, a first power supply IC 52 is provided so as to correspond to the group of the first inverter 12 and the step-up converter 30, and a second power supply IC 54 is provided so as to correspond to the second inverter 22. The first power supply IC 52 controls drive voltage applied to the upper and lower arm step-up drive circuits Drcp, Drcn and the first $-phase upper and lower arm drive circuits Dr1$p, and Dr1$n. The second power supply IC 54 controls drive voltage applied to the second $-phase upper and lower arm drive circuits Dr2$p, and Dr2$n.

FIG. 4 shows the insulated power supply apparatus in which the first power supply IC 52 is a main controller.

The insulated power supply apparatus shown in FIG. 4 is a flyback type switching power supply including first to fifth transformers 60, 62, 64, 66, 68, first to fifth diodes 70a, 72a, 74a, 76a, 78a, first to fifth capacitors 70b, 72b, 74b, 76b, 78b, one N-channel MOSFET (hereinafter, referred to as "first voltage control switching element 80"), and a first feedback circuit 82. Note that, in the present embodiment, electrolytic capacitors are used as the first to fifth capacitors 70b, 72b, 74b, 76b, 78b. In addition, in the present embodiment, each of the first to fourth transformers 60, 62, 64, 66 corresponds to an "upper arm transformer". The fifth transformer 68 corresponds to a "lower arm transformer".

The upper arm transformers are provided so as to individually correspond to the plurality of upper arm switching elements. Specifically, the first transformer 60 applies drive voltage to the upper arm step-up drive circuit Drcp. The second transformer 62 applies drive voltage to a first U-phase upper arm drive circuit Dr1Up. The third transformer 64 applies drive voltage to a first V-phase upper arm drive circuit Dr1Vp. The fourth transformer 66 applies drive voltage to a first W-phase upper arm drive circuit Dr1Wp.

The lower arm transformer is common to the plurality of lower arm switching elements, and has a common secondary side coil which can apply drive voltage to the lower arm switching elements. Specifically, the fifth transformer 68, which is the common transformer, applies drive voltage to the lower arm step-up drive circuit Drcn and the first U-, V-, W-phase lower arm drive circuits Dr1Un, Dr1Vn, Dr1Wn.

The positive electrode terminal of the low-voltage battery 42 is connected to the negative electrode terminal of the low-voltage battery 42 via a parallel connection of first to fifth primary side coils 60a, 62a, 64a, 66a, 68a configuring the first to fifth transformers 60, 62, 64, 66, 68 and via the first voltage control switching element 80. That is, the first voltage control switching element 80 is provided so as to form a closed circuit including the parallel connection of the first to fifth primary side coils 60a, 62a, 64a, 66a, 68a, the low-voltage battery 42, and the first voltage control switching element 80, when the first voltage control switching element 80 is turned on.

A first secondary side coil 60b configuring the first transformer 60 is connected to the upper arm step-up drive circuit Drcp via the first diode 70a and the first capacitor 70b. A second secondary side coil 62b configuring the second transformer 62 is connected to the first U-phase upper arm drive circuit Dr1Up via the second diode 72a and the second capacitor 72b. A third secondary side coil 64b configuring the third transformer 64 is connected to the first V-phase upper arm drive circuit Dr1Vp via the third diode 74a and the third capacitor 74b. A fourth secondary side coil 66b configuring the fourth transformer 66 is connected to the first W-phase upper arm drive circuit Dr1Wp via the fourth diode 76a and the fourth capacitor 76b.

The fourth transformer 66 further includes a first feedback coil 66c serving as a "voltage detection coil". The first feedback coil 66c is connected to the first power supply IC 52 via the first feedback circuit 82. Specifically, the first feedback circuit 82 includes a first detection diode 82a, a first detection capacitor 82b, a first resistor 82c, and a second resistor 82d. The first feedback circuit 82 has a so-called rectification function of converting the output voltage of the first feedback coil 66c to DC voltage. The output voltage of the first feedback coil 66c passes through the first detection diode 82a, and then is divided by the first resistor 82c and the second resistor 82d. The voltage divided by the first resistor 82c and the second resistor 82d (hereinafter, referred to as "first feedback voltage Vfb1") is applied to the first power supply IC 52 via a first detection terminal Tfb1 of the first power supply IC 52. Note that FIG. 4 shows terminals Ta1 to Ta4, Ta5, Ta8 of the fourth transformer 66 and the like. The terminals are described later.

A fifth secondary side coil 68b configuring the fifth transformer 68 is connected to the lower arm step-up drive circuit Drcn and the first U-, V-, W-phase lower arm drive circuits Dr1Un, Dr1Vn, Dr1Wn via the fifth diode 78a and the fifth capacitor 78b.

Note that, in the present embodiment, the number of turns of the first to fifth secondary side coils 60b, 62b, 64b, 66b, 68b and that of the first feedback coil 68c are set to be the same. This aims to equalize the output voltage of the first feedback coil 68c and that of the first to fifth secondary side coils 60b, 62b, 64b, 66b, 68b.

The first power supply IC 52 is one integrated circuit. The first power supply IC 52 turns on or off the first voltage control switching element 80 to perform feedback control so that the first feedback voltage Vfb1 reaches the target voltage Vtgt. In the present embodiment, the first power supply IC 52, the first voltage control switching element 80, and the first feedback circuit 82 configure a first power supply control section CT1.

In the present embodiment, the turn ratios of the first to fourth transformers 60, 62, 64, 66 (the value obtained by dividing the number of turns N2 of the secondary side coil by the number of turns N1 of the primary side coil), which are the upper arm transformers, are set to be smaller than the number of turns of the fifth transformer 68, which is the lower arm transformer. This aims to make smaller the variation in the output voltage of the first to fifth transformers 60, 62, 64, 66, 68.

That is, in the present embodiment, a current I3 is larger than a current I1 and a current I2. The current I1 is supplied from the first secondary side coil 60b to the upper arm step-up drive circuit Drcp. The current I2 is supplied from the second to fourth secondary side coils 62b, 64b, 66b to the first U-, V-, W-phase upper arm drive circuits Dr1Up, Dr1Vp, Dr1Wp. The current I3 is supplied from the fifth secondary side coil 68b to the first U-, V-, W-phase lower arm drive circuits Dr1Un, Dr1Vn, Dr1Wn. Note that as charging current to be supplied to the gate increases, the output voltage of the secondary side coil decreases. This is because, when exemplifying the first U-phase upper arm switching element S1Up, as the charging current increases, the output current of the second secondary side coil 62b increases, which increases the amount of voltage drop due to DC resistance of the second secondary side coil 62b, the second diode 72a and the like.

Hence, by setting the turn ratios of the first to fourth transformers 60, 62, 64, 66 to be smaller than that of the fifth transformer 68, the variation in the output voltage of the first to fifth transformers 60, 62, 64, 66, 68 can be smaller.

Note that the turn ratio of the first transformer 60 is set to be larger than those of the second to fourth transformers 62, 64, 68. This is because the charging current supplied to the gates of the upper and lower arm step-up switching elements Sc#, to turn on the upper and lower arm step-up switching elements, is larger than the charging current supplied to the gates of the first $-phase upper and lower arm switching elements S1$#, to turn on the first $-phase upper and lower arm switching elements S1$#. That is, this is because the gate charge capacity Qg of the upper and lower arm step-up switching elements Scp, Scn is set to be larger than the gate charge capacity Qg of the first $-phase upper and lower arm switching elements S1$#.

FIG. 5 shows the insulated power supply apparatus in which the second power supply IC 54 is a main controller.

The insulated power supply apparatus shown in FIG. 5 is a flyback type switching power supply including sixth to ninth transformers 90, 92, 94, 96, sixth to ninth diodes 100a, 102a, 104a, 106a, sixth to ninth capacitors 100b, 102b, 104b, 106b, one N-channel MOSFET (hereinafter, referred to as "second voltage control switching element 110"), and a second feedback circuit 112. Note that, in the present embodiment, electrolytic capacitors are used as the sixth to ninth capacitors 100b, 102b, 104b, 106b. In addition, in the present embodiment, each of the sixth to eighth transformers 90, 92, 94 corresponds to an "upper arm transformer". The ninth transformer 96 corresponds to a "lower arm transformer".

The sixth transformer 90 applies drive voltage to a second U-phase upper arm drive circuit Dr2Up. The seventh transformer 92 applies drive voltage to a second V-phase upper arm drive circuit Dr2Vp. The eighth transformer 94 applies drive voltage to a second W-phase upper arm drive circuit Dr2Wp.

The ninth transformer 96 applies drive voltage to the second U-, V-, W-phase lower arm drive circuits Dr2Un, Dr2Vn, Dr2Wn.

The positive electrode terminal of the low-voltage battery 42 is connected to the negative electrode terminal of the low-voltage battery 42 via a parallel connection of sixth to ninth primary side coils 90a, 92a, 94a, 96a configuring the sixth to ninth transformers 90, 92, 94, 96 and via the second voltage control switching element 110. That is, the second voltage control switching element 110 is provided so as to form a closed circuit including the parallel connection of the sixth to ninth primary side coils 90a, 92a, 94a, 96a, the low-voltage battery 42, and the second voltage control switching element 110 when the second voltage control switching element 110 is turned on.

A sixth secondary side coil 90b configuring the sixth transformer 90 is connected to the second U-phase upper arm drive circuit Dr2Up via the sixth diode 100a and the sixth capacitor 100b. A seventh secondary side coil 92b configuring the seventh transformer 92 is connected to the second V-phase upper arm drive circuit Dr2Vp via the seventh diode 102a and the seventh capacitor 102b. A eighth secondary side coil 104b configuring the eighth transformer 94 is connected to the second W-phase upper arm drive circuit Dr2Wp via the eighth diode 104a and the eighth capacitor 104b.

The eighth transformer 94 further includes a second feedback coil 96c serving as a "voltage detection coil". The second feedback coil 94c is connected to the second power supply IC 54 via the second feedback circuit 112. Specifically, the second feedback circuit 112 includes a second detection diode 112a, a second detection capacitor 112b, a third resistor 112c, and a fourth resistor 112d. The output voltage of the second feedback coil 96c passes through the second detection diode 112a, and then is divided by the third resistor 112c and the fourth resistor 112d. The voltage divided by the third resistor 112c and the fourth resistor 112d (hereinafter, referred to as "second feedback voltage Vfb2") is applied to the second power supply IC 54 via a second detection terminal Tfb2 of the second power supply IC 54.

A ninth secondary side coil 96b configuring the ninth transformer 96 is connected to the second U-, V-, W-phase lower arm drive circuits Dr2Un, Dr2Vn, Dr2Wn via the ninth diode 106a and the ninth capacitor 106b.

Note that, in the present embodiment, the number of turns of the sixth to ninth secondary side coils 90b, 92b, 94b, 96b and that of the second feedback coil 94c are set to be the same. This aims to equalize the output voltage of the second feedback coil 94c and that of the sixth to ninth secondary side coils 90b, 92b, 94b, 96b.

The second power supply IC 54 is one integrated circuit. The second power supply IC 54 turns on or off the second voltage control switching element 110 to perform feedback control so that the second feedback voltage Vfb2 reaches the target voltage Vtgt. In the present embodiment, the second power supply IC 54, the second voltage control switching element 110, and the second feedback circuit 112 configure a second power supply control section CT2.

In the present embodiment, the turn ratios of the sixth to eighth transformers 90, 92, 94 are set to be smaller than the number of turns of the ninth transformer 96 which is the lower arm transformer. This aims to make smaller the variation in the output voltage of the sixth to ninth transformers 90, 92, 94, 96. That is, in the present embodiment, a current I5 is larger than a current I4. The current I4 is supplied from the sixth to eighth secondary side coils 90b, 92b, 94b to the second U-, V-, W-phase upper arm drive circuits Dr2Up, Dr2Vp, Dr2Wp. The current I5 is supplied from the ninth secondary side coils 96b to the second U-, V-, W-phase lower arm drive circuits Dr2Un, Dr2Vn, Dr2Wn.

Figure 6:
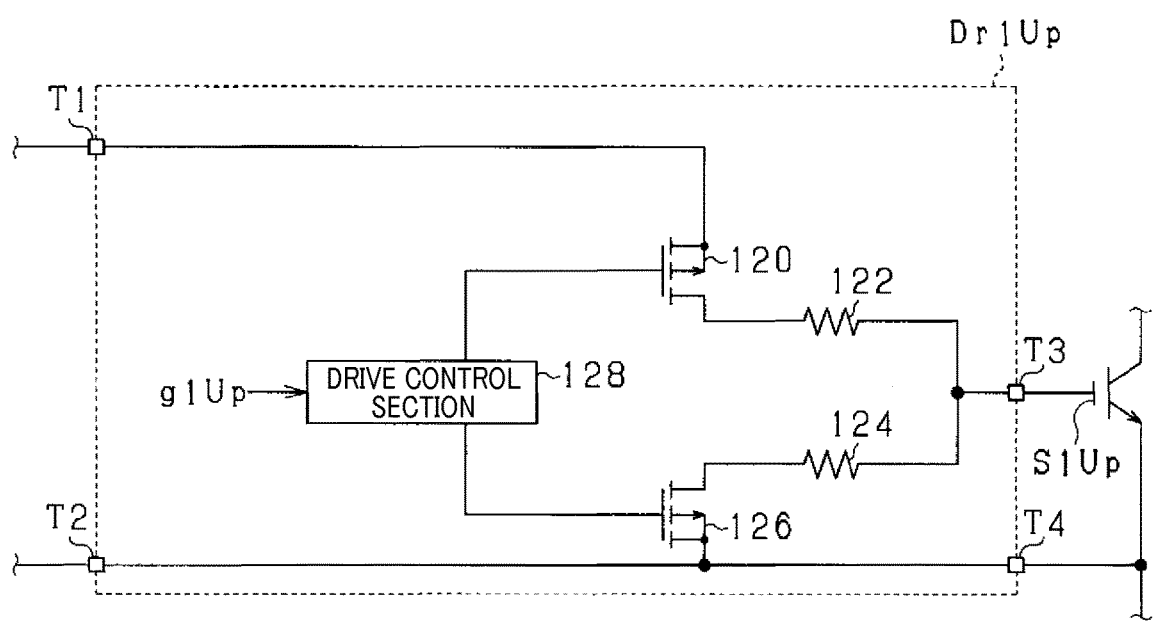
FIG. 6 is a diagram showing an IGBT drive circuit according to the first embodiment.

Next, with reference to FIG. 6, the drive circuits Drc#, Dr1$#, Dr2$# are described in detail. The drive circuits Drc#, Dr1$#, Dr2$# have the same configuration. Hence, the configuration of the drive circuit is described by taking the first U-phase upper arm drive circuit Dr1Up as an example.

The connection point of the second diode 72a and the second capacitor 72b is connected to a first terminal T1 of the first U-phase upper arm drive circuit Dr1Up shown in FIG. 6. The connection point of the second secondary side coil 62b and the second capacitor 72b is connected to a second terminal T2 of the first U-phase upper arm drive circuit Dr1Up.

The first terminal T1 is connected to the gate of the first U-phase upper arm switching element S1Up via a P-channel MOSFET (hereinafter, referred to as a "charging switching element 120"), a charging resistor 122, and a third terminal T3 of the first U-phase upper arm drive circuit Dr1Up. The gate of the first U-phase upper arm switching element S1Up is connected to the emitter of the first U-phase upper arm switching element S1Up via the third terminal T3, a discharging resistor 124, an N-channel MOSFET (hereinafter, referred to as a "discharging switching element 126"), and a fourth terminal T4 of the first U-phase upper arm drive circuit Dr1Up. The second terminal T2 is short-circuited to the fourth terminal T4 in the first U-phase upper arm drive circuit Dr1Up.

The first U-phase upper arm drive circuit Dr1Up includes a drive control section 128. The drive control section 128 alternately performs a charging process and a discharging process by operations of the charging switching element 120 and the discharging switching element 126 based on an operation signal g1Up received from the control unit 40 via the interface 44, to drive the first U-phase upper arm switching element S1Up. Specifically, in the charging process, if the operation signal g1Up is determined to have been an ON operation command, the discharging switching element 126 is turned off, and the charging switching element 120 is turned on. In the discharging process, if the operation signal g1Up is determined to have been an OFF operation command, the discharging switching element 126 is turned on, and the charging switching element 120 is turned off. Hence, the first U-phase upper arm switching element S1Up is driven.

Figure 7:
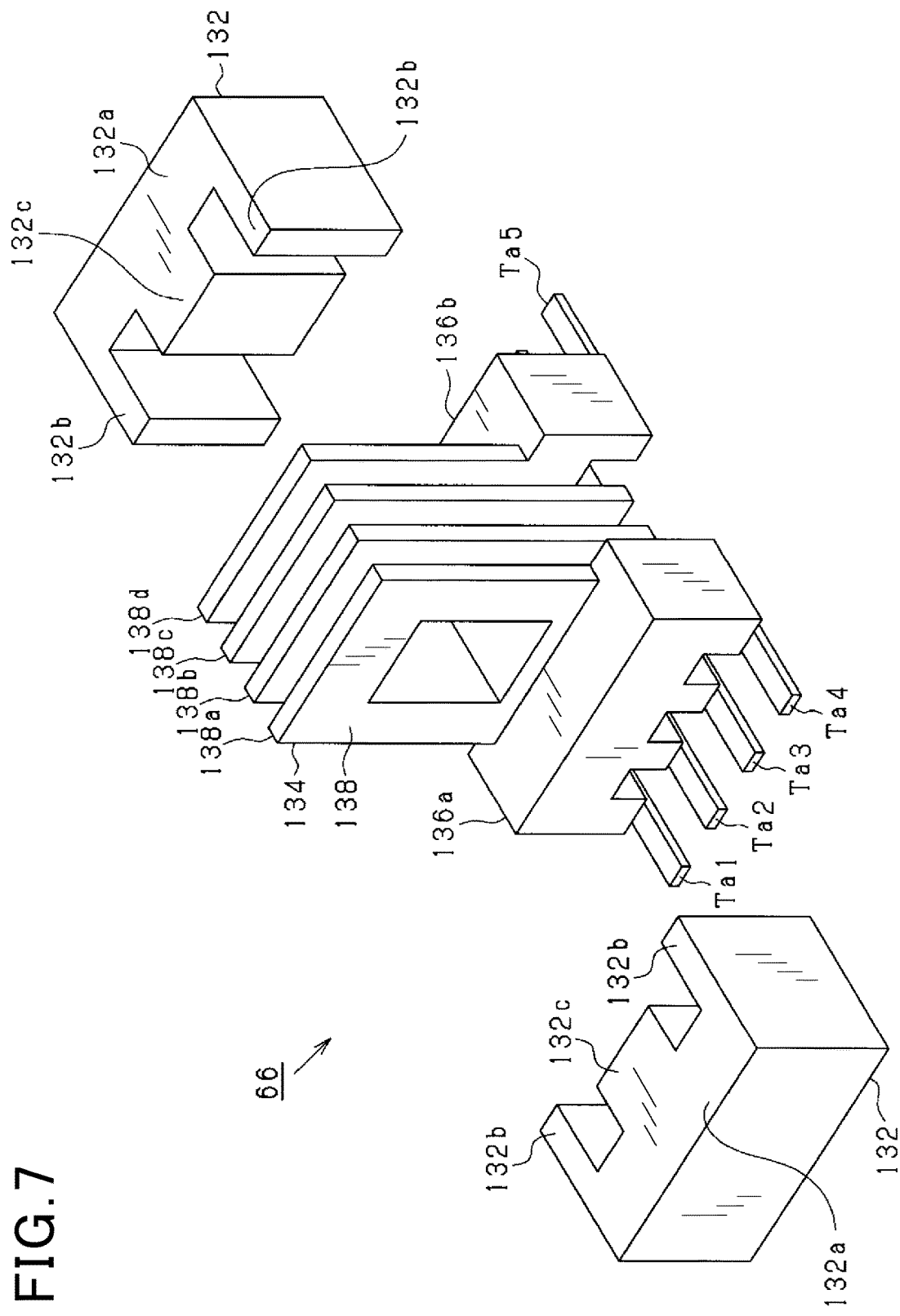
FIG. 7 is a perspective view of a transformer according to the first embodiment.
Figure 8:
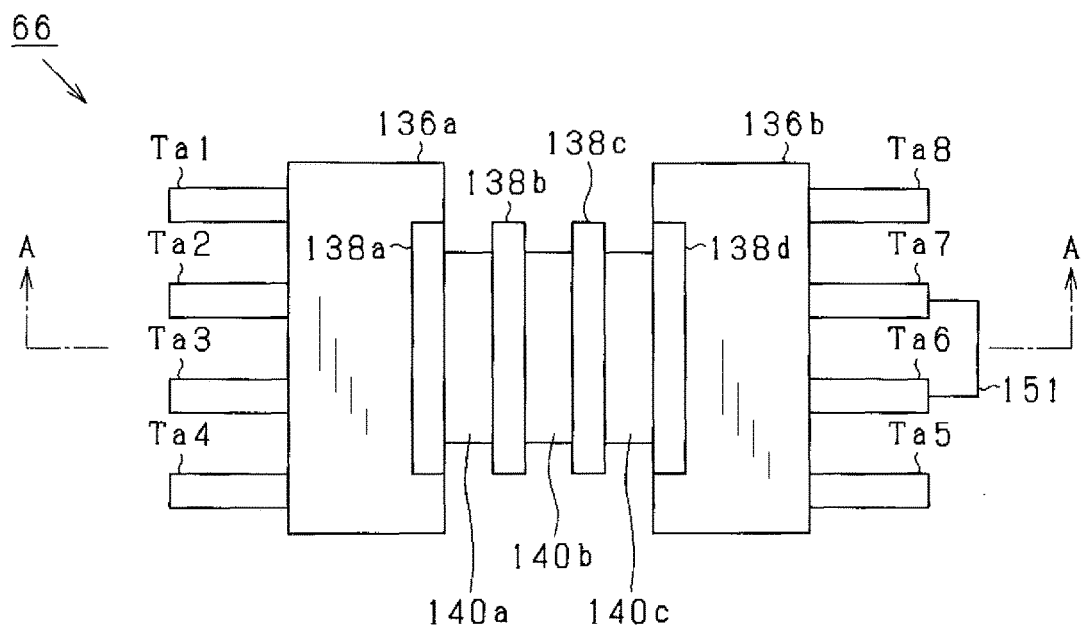
FIG. 8 is a plan view of the transformer according to the first embodiment.
Figure 9:
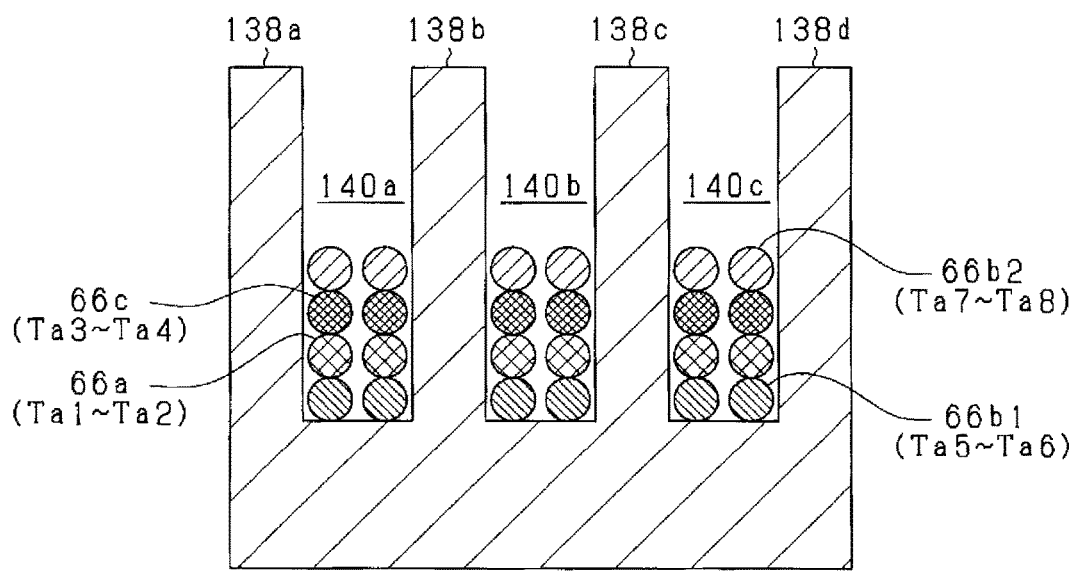
FIG. 9 is a sectional view cut along the line A-A of a circular portion in FIG. 8.

Next, with reference to FIGS. 7 to 9, the configuration of the transformers 60, 62, 64, 66, 68, 90, 92, 94, 96 is described by taking the fourth transformer 66 as an example. FIG. 7 is a perspective view of the fourth transformer 66. FIG. 8 is a plan view of the fourth transformer 66. FIG. 9 is a part of a sectional view cut along the line A-A of FIG. 8. Note that, in FIGS. 7 and 8, the fourth primary side coil 66a and the fourth secondary side coil 66b are not shown.

As shown in FIG. 7, the transformer 66 includes a pair of cores 132 and a bobbin 134. The cores 132 are a pair of members having the same shape. Each of the members has a bottom wall part 132a having a long-length shape, a pair of sidewall parts 132b, and a center wall part 132c. The pair of sidewall parts 132b respectively extend from one end and the other end, which are positioned in the longitudinal direction of the bottom wall part 132a, in the direction departing from bottom wall part 132a. The center wall part 132c extends from the center portion, which is positioned at the center in the longitudinal direction of the bottom wall part 132a, in the direction departing from the bottom wall part 132a. That is, the core 132 has a substantially E-shape.

End faces of the pair of sidewall parts 132b included in one of the pair of members contact end faces of the sidewall parts 132b included in the other of the pair of members. An end face of the center wall part 132c included in one of the pair of members does not contact an end face of the center wall part 132c included in the other of the pair of members. The end faces are separated from each other.

The bobbin 134 is made of insulating resin, and includes a first terminal block 136a, a second terminal block 136b, and a circular portion 138. The circular portion 138 has a circular cross-sectional shape perpendicularly cut with respect to the axial direction (the direction in which the center wall part 132c is inserted). In the space formed by the inner periphery, the center wall part 132c of the core 132 is inserted.

On the peripheral surface of the circular portion 138, a plurality of division plates (first to fourth division plates 138a to 138d) are provided. The first to fourth division plates 138a to 138d erect in plate shapes over the whole circumference and along the circumferential direction of the peripheral surface of the circular portion 138. The first to fourth division plates 138a to 138d divide the peripheral surface of the circular portion 138 into three sections in the axial direction thereof. In the present embodiment, as shown in FIG. 8, the sections are referred to as a first section 140a, a second section 140b, and a third section 140c from left to right.

One of two ends positioned in the axial direction of the circular portion 138 is provided with the first terminal block 136a. The other of the two ends is provided with the second terminal block 136b. The first terminal block 136a and the second terminal block 136b are made of the same insulating resin as that of the circular portion 138. Hence, the first terminal block 136a and the second terminal block 136b are integrated with the circular portion 138.

The first terminal block 136a is provided with the first to fourth transformer terminals Ta1 to Ta4. The terminals Ta1 to Ta4 are arranged at predetermined intervals and along the longitudinal direction of the first terminal block 136a. The second terminal block 136b is provided with the fifth to eighth transformer terminals Ta5 to Ta8. The terminals Ta5 to Ta8 are arranged at predetermined intervals and along the longitudinal direction of the second terminal block 136b.

The fourth primary side coil 66a, the fourth secondary side coil 66b, and first feedback coil 66c are insulated lines made of copper lines provided with an insulation film having high electrical insulation characteristics. The fourth secondary side coil 66b is formed of a first winding 66b1 and a second winding 66b2. As shown in FIG. 9, the fourth primary side coil 66a, the first winding 66b1, the second winding 66b2, and the first feedback coil 66c are wound around the outer periphery surface of the circular portion 138 in the first to third sections 140a to 140c so as to be laminated. Note that the way of winding is employed to heighten the coefficient of coupling between the fourth primary side coil 66a, the fourth secondary side coil 66b, and the first feedback coil 66, thereby making smaller the variation of the output voltage of the first to third and fifth secondary side coils 60b, 62b, 64b, 68b with respect to the target voltage Vtgt.

One end of the first winding 66b1 serving as one end of the fourth secondary side coil 66b is connected to the eighth transformer terminal Ta8. The eighth transformer terminal Ta8 is connected to the anode of the fourth diode 76a. The other end of the first winding 66b1 is connected to the seventh transformer terminal Ta7. The seventh transformer terminal Ta7 is connected to the sixth transformer terminal Ta6 by a wiring pattern 151 formed on a substrate 150. The sixth transformer terminal Ta6 is connected to one end of the second winding 66b2. The other end of the second winding 66b2 is the other end of the fourth secondary side coil 66b, and is connected to the fifth transformer terminal Ta5. The fifth transformer terminal Ta5 is connected to the negative electrode terminal of the fourth capacitor 76b.

One end of the first feedback coil 66c is connected to the third transformer terminal Ta3. The other end of the first feedback coil 66c is connected to the fourth transformer terminal Ta4. The third transformer terminal Ta3 is connected to the anode of the first detection diode 82a. The fourth transformer terminal Ta4 is grounded.

Note that, in the present embodiment, the first to third transformers 60, 62, 64, the fifth to seventh transformers 68, 90, 92, and the ninth transformer 96 do not include a feedback coil as described above. Hence the structure of the transformers 60, 62, 64, 68, 90, 92, 96 can be obtained by eliminating the third transformer terminal Ta3 and the fourth transformer terminal Ta4 from the fourth transformer 66 shown in FIGS. 7 and 8 and by eliminating the first feedback coil 66c shown in FIG. 9.

Figure 10:
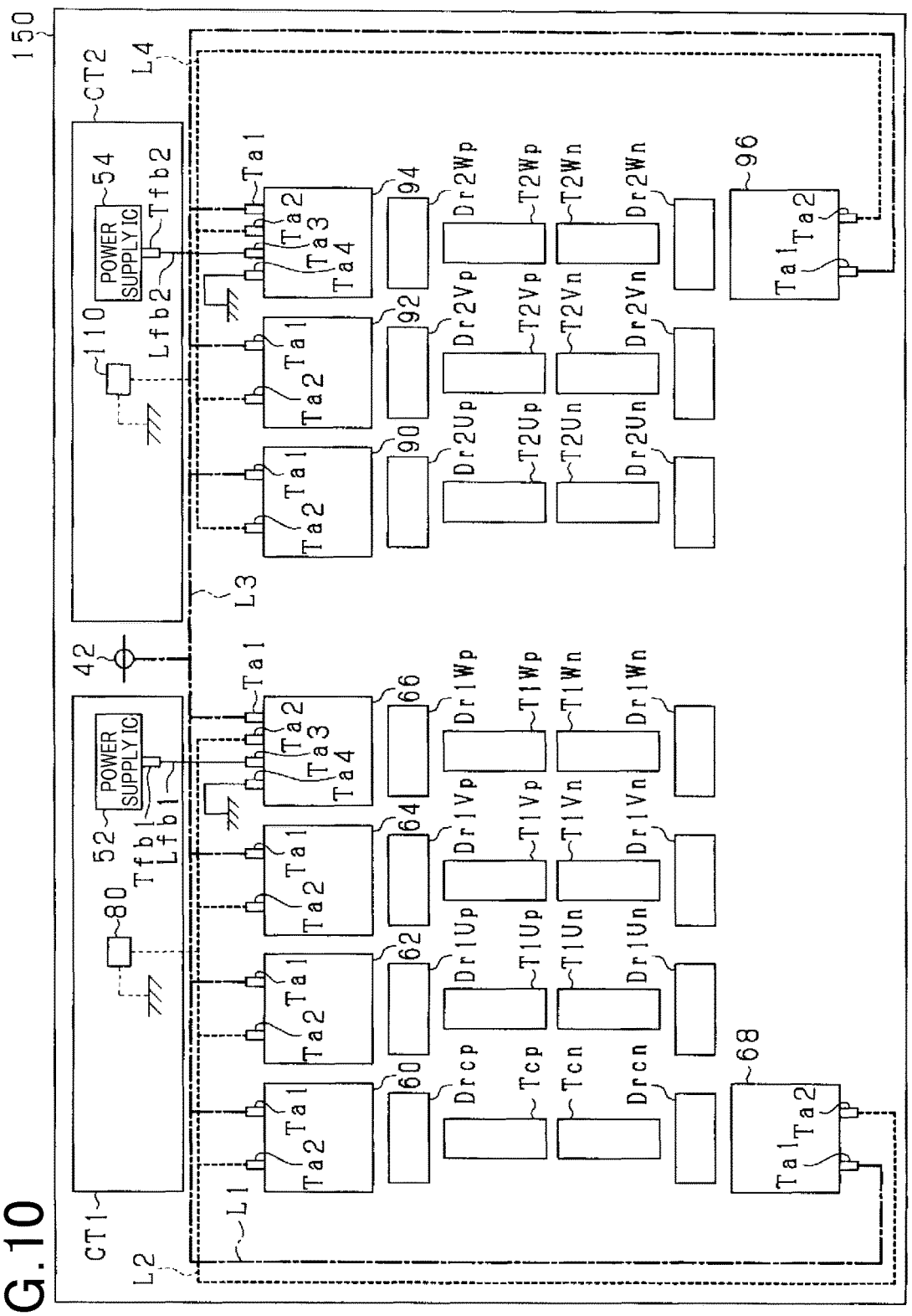
FIG. 10 is a plan view of a substrate according to the first embodiment.

Next, with reference to FIG. 10, a technique for arranging the transformers and the like on the substrate 150 is described. In FIG. 10, the first feedback circuit 82, the second feedback circuit 112, the fifth to eighth transformer terminals Ta5 to Ta8 included in the transformers and the like are not shown.

As shown in FIG. 10, the substrate 150 is a multilayer substrate having a rectangular shape. The substrate 150 has a pair of external layers (a first surface and a second surface which is the back of the first surface), and a plurality of internal layers sandwiched between the pair of external layers. When viewing the first surface of the substrate 150 from the front thereof, a step-up upper arm connection section Tcp and first U-, V-, W-phase upper arm connection sections T1Up, T1Vp, T1Wp (hereinafter, referred to as "first upper arm connection section") are provided on the substrate 150 so as to be arranged in line. In addition, the first upper arm connection sections Tcp, T1Up, T1Vp, T1Wp are provided on the center portion of the substrate 150 positioned in the direction, in which a plane parallel to the surface of the substrate 150 extends and which is orthogonal to the direction in which the connection sections Tcp, T1Up, T1Vp, T1Wp are arranged.

Meanwhile, when viewing the first surface of the substrate 150 from the front thereof, second U-, V-, W-phase upper arm connection sections T2Up, T2Vp, T2Wp (hereinafter, referred to as "second upper arm connection section") are provided on the substrate 150 so as to be arranged in line and in the direction in which the first upper arm connection sections Tcp, T1Up, T1Vp, T1Wp are arranged. In addition, the second upper arm connection sections T2Up, T2Vp, T2Wp are provided on the center portion of the substrate 150 positioned in the direction, in which a plane parallel to the surface of the substrate 150 extends and which is orthogonal to the direction in which the connection sections T2Up, T2Vp, T2Wp are arranged. When viewing the first surface of the substrate 150 from the front thereof, the second upper arm connection sections T2Up, T2Vp, T2Wp and the first upper arm connection sections Tcp, T1Up, T1Vp, T1Wp are provided in series.

When viewing the first surface of the substrate 150 from the front thereof, a step-up lower arm connection section Tcn and first U-, V-, W-phase lower arm connection sections T1Un, T1Vn, T1Wn (hereinafter, referred to as "first lower arm connection section") are provided so as to be arranged in line and in the direction in which the first upper arm connection sections Tcp, T1Up, T1Vp, T1Wp are arranged. In addition, when viewing the first surface of the substrate 150 from the front thereof, the first lower arm connection sections Tcn, T1Un, T1Vn, T1Wn are provided in parallel with the first upper arm connection sections Tcp, T1Up, T1Vp, T1Wp. When viewing the first surface of the substrate 150 from the front thereof, second U-, V-, W-phase lower arm connection sections T2Un, T2Vn, T2Wn (hereinafter, referred to as "second lower arm connection section") are provided so as to be arranged in line and in the direction in which the second upper arm connection sections T2Up, T2Vp, T2Wp are arranged. In addition, when viewing the first surface of the substrate 150 from the front thereof, the second lower arm connection sections T2Un, T2Vn, T2Wn are provided in parallel with the second upper arm connection sections T2Up, T2Vp, T2Wp. When viewing the first surface of the substrate 150 from the front thereof, the second lower arm connection sections T2Un, T2Vn, T2Wn and the first lower arm connection sections Tcn, T1Un, T1Vn, T1Wn are provided in series.

The step-up module Mc is attached to the step-up upper and lower arm connection sections Tcp, Tcn from the side of the second surface of the substrate 150. Thereby, the gates of the upper and lower arm step-up switching elements Scp, Scn are connected to the step-up upper and lower arm connection sections Tcp, Tcn (see FIG. 3). The first $-phase modules M1$ are attached to the first $ phase upper and lower arm connection sections T1$p, T1$n from the side of the second surface of the substrate 150. Thereby, the gates of the first $-phase upper and lower arm switching elements S1$p, S1$n are connected to the first $ phase upper and lower arm connection sections T1$p, T1$n. In addition, the second $-phase modules M2$ are attached to the second $ phase upper and lower arm connection sections T2$p, T2$n from the side of the second surface of the substrate 150. Thereby, the gates of the second $-phase upper and lower arm switching elements S2$p, S2$n are connected to the second $ phase upper and lower arm connection sections T2$p, T2$n. As a result, the gates and the emitters of the switching elements Sc#, S1$#, S2$# and the third terminals T3 and the fourth terminals T4 of the drive circuits Drc#, Dr1$# corresponding to thereto are connected.

When viewing the first surface of the substrate 150 from the front thereof, the first to fourth transformers 60, 62, 64, 66 corresponding to the first power supply control section CT1 are provided in an area opposed to the first lower arm connection sections Tcn, T1Un, T1Vn, T1Wn with respect to the first upper arm connection sections Tcp, T1Up, T1Vp, T1Wp (that is, the first to fourth transformers 60, 62, 64, 66 corresponding to the first power supply control section CT1 are provided in an area located with the first upper arm connection sections Tcp, T1Up, T1Vp, T1Wp between the area and the first lower arm connection sections Tcn, T1Un, T1Vn, T1Wn). The first to fourth transformers 60, 62, 64, 66 are provided in the direction in which the first upper arm connection sections Tcp, T1Up, T1Vp, T1Wp are arranged, and so as to be arranged in line.

When viewing the first surface of the substrate 150 from the front thereof, the first power supply control section CT1 is provided in an area opposed to the first upper arm connection sections Tcp, T1Up, T1Vp, T1Wp arranged in line with respect to the first to fourth transformers 60, 62, 64, 66 arranged in line (that is, the first power supply control section CT1 is provided in an area located with the first to fourth transformers 60, 62, 64, 66 between the area and the first upper arm connection sections Tcp, T1Up, T1Vp, T1Wp). The first to fourth transformers 60, 62, 64, 66 are provided so that the first transformer terminals Ta1 and the second transformer terminals Ta2 thereof are adjacent to the first power supply control section CT1.

Note that, when viewing the first surface of the substrate 150 from the front thereof, in an area between the first upper arm connection sections Tcp, T1Up, T1Vp, T1Wp arranged in line and the first to fourth transformers 60, 62, 64, 66 arranged in line, the upper arm drive circuits Drcp, Dr1Up, Dr1Vp, Dr1Wp corresponding to the first power supply control section CT1 are provided in the direction in which the first upper arm connection sections Tcp, T1Up, T1Vp, T1Wp are arranged, and so as to be arranged in line.

When viewing the first surface of the substrate 150 from the front thereof, the fifth transformer 68 is provided in the vicinity of the step-up lower arm connection section Tcn, which is closest to one side of the substrate 150 positioned in the direction in which the connection sections Tcn, T1Un, T1Vn, T1Wn are arranged (in FIG. 10, the side at the left edge of the substrate 150, provided that the position of the low-voltage battery 42 is defined as the upper side of the substrate 150), among the first lower arm connection sections Tcn, T1Un, T1Vn, T1Wn. Specifically, when viewing the first surface of the substrate 150 from the front thereof, the fifth transformer 68 is provided in an area opposed to the step-up upper arm connection section Tcp with respect to the step-up lower arm connection section Tcn. The fifth transformer 68 is arranged so that the first transformer Ta1 and the second transformer Ta2 thereof are provided on the side opposed to the lower arm connection section Tcn.

Note that, in the present embodiment, when viewing the first surface of the substrate 150 from the front thereof, the lower arm drive circuits Drcn, Dr1Un, Dr1Vn, Dr1Wn corresponding to the first power supply control section CT1 are arranged in line and in the direction in which the first lower arm connection sections Tcn, T1Un, T1Vn, T1Wn are arranged, so as to be adjacent to the connection sections Tcn, T1Un, T1Vn, T1Wn. When viewing the first surface of the substrate 150 from the front thereof, the lower arm step-up drive circuit Drcn is provided in an area between the fifth transformer 68 and the lower arm connection section Tcn.

Meanwhile, when viewing the first surface of the substrate 150 from the front thereof, the sixth to eighth transformers 90, 92, 94 corresponding to the second power supply control section CT2 are provided in an area opposed to the second lower arm connection sections T2Un, T2Vn, T2Wn with respect to the second upper arm connection sections T2Up, T2Vp, T2Wp (that is, the sixth to eighth transformers 90, 92, 94 corresponding to the second power supply control section CT2 are provided in an area located with the second upper arm connection sections T2Up, T2Vp, T2Wp between the area and the second lower arm connection sections T2Un, T2Vn, T2Wn). The sixth to eighth transformers 90, 92, 94 are provided in the direction in which the second upper arm connection sections T2Up, T2Vp, T2Wp are arranged, so as to be arranged in line.

When viewing the first surface of the substrate 150 from the front thereof, the second power supply control section CT2 is provided in an area opposed to the second upper arm connection sections T2Up, T2Vp, T2Wp arranged in line, with respect to the sixth to eighth transformers 90, 92, 94 arranged in line (that is, the second power supply control section CT2 is provided in an area located with the sixth to eighth transformers 90, 92, 94 between the area and the second upper arm connection sections T2Up, T2Vp, T2Wp arranged in line). The sixth to eighth transformers 90, 92, 94 are provided so that the first transformer terminals Ta1 and the second transformer terminals Ta2 thereof are adjacent to the second power supply control section CT2.

Note that, when viewing the first surface of the substrate 150 from the front thereof, in an area between the second upper arm connection sections T2Up, T2Vp, T2Wp arranged in line and the sixth to eighth transformers 90, 92, 94 arranged in line, the upper arm drive circuits Dr2Up, Dr2Vp, Dr2Wp corresponding to the second power supply control section CT2 are arranged in line and in the direction in which the second upper arm connection sections T2Up, T2Vp, T2Wp are arranged.

When viewing the first surface of the substrate 150 from the front thereof, the ninth transformer 96 is provided in the vicinity of the second W-phase lower arm connection section T2Wn, which is closest to one side of the substrate 150 positioned in the direction in which the connection sections T2Un, T2Vn, T2Wn are arranged (in FIG. 10, the side at the right edge of the substrate 150, provided that the position of the low-voltage battery 42 is defined as the upper side of the substrate 150), among the second lower arm connection sections T2Un, T2Vn, T2Wn. Specifically, when viewing the first surface of the substrate 150 from the front thereof, the ninth transformer 96 is provided in an area opposed to the second W-phase upper arm connection section T2Wp with respect to the second W-phase lower arm connection section T2Wn (that is, the ninth transformer 96 is provided in an area located with the second W-phase lower arm connection section T2Wn between the area and the second W-phase upper arm connection section T2Wp). The ninth transformer 96 is arranged so that the first transformer Ta1 and the second transformer Ta2 thereof are provided on the side opposed to the second W-phase lower arm connection section T2Wn.

Note that, in the present embodiment, when viewing the first surface of the substrate 150 from the front thereof, the lower arm drive circuits Dr2Un, Dr2Vn, Dr2Wn corresponding to the second power supply control section CT2 are arranged in line and in the direction in which the second lower arm connection sections T2Un, T2Vn, T2Wn are arranged, so as to be adjacent to the connection sections T2Un, T2Vn, T2Wn. When viewing the first surface of the substrate 150 from the front thereof, the second W-phase lower arm drive circuit Dr2Wn is provided in an area between the ninth transformer 96 and the second W-phase lower arm connection section T2Wn.

When viewing the first surface of the substrate 150 from the front thereof, the low-voltage battery 42 is provided in an area opposed to the first and second lower arm connection sections Tcn, T1Un, T1Vn, T1Wn, T2Un, T2Vn, T2Wn with respect to the first and second upper arm connection sections Tcp, T1Up, T1Vp, T1Wp, T2Up, T2Vp, T2Wp (that is, the low-voltage battery 42 is provided in an area located with the first and second upper arm connection sections Tcp, T1Up, T1Vp, T1Wp, T2Up, T2Vp, T2Wp between the area and the first and second lower arm connection sections Tcn, T1Un, T1Vn, T1Wn, T2Un, T2Vn, T2Wn). In the present embodiment, specifically, the low-voltage battery 42 is provided between the first power supply control section CT1 and the second power supply control section CT2.

In the present embodiment, the first detection terminal Tfb1 of the first power supply IC 52 and the third transformer terminal Ta3 of the fourth transformer 66 are connected by a first electric path Lfb1. The first electric path Lfb1 is configured by a wiring pattern formed on the first feedback circuit 82 and the substrate 150, and transfers the first feedback voltage Vfb1 to the first power supply IC 52. Specifically, the first electric path Lfb1 is a path extending from the third transformer terminal Ta3 of the fourth transformer 66 to the first detection terminal Tfb1 via the first feedback circuit 82.

In the present embodiment, the second detection terminal Tfb2 of the second power supply IC 54 and the third transformer terminal Ta3 of the eighth transformer 94 are connected by a second electric path Lfb2. The second electric path Lfb2 is configured by a wiring pattern formed on the second feedback circuit 112 and the substrate 150, and transfers the second feedback voltage Vfb2 to the second power supply IC 54. Specifically, the second electric path Lfb2 is a path extending from the third transformer terminal Ta3 of the eighth transformer 94 to the second detection terminal Tfb2 via the second feedback circuit 112.

The first transformer terminals Ta1 of the first to fifth transformers 60, 62, 64, 66, 68 are connected to each other by a first wiring pattern L1 (in FIG. 10, drawn by an alternate long and short dash line) provided on the substrate 150, and are connected to the low-voltage battery 42 by the first wiring pattern L1. Specifically, when viewing the first surface of the substrate 150 from the front thereof, the first wiring pattern L1 is formed so as to extend from the low-voltage battery 42 to the first transformer terminal Ta1 of the fifth transformer 68 through a first area and a second area. The first area is sandwiched between the first power supply control section CT1 and the first to fourth transformers 60, 62, 64, 66 arranged in line, when viewing the first surface of the substrate 150 from the front thereof. The second area is, when viewing the first surface of the substrate 150 from the front thereof, sandwiched between the step-up upper and lower arm connection sections Tcp, Tcn, which are closest to one side of the substrate 150 positioned in the direction in which the first upper and lower arm connection sections Tcp, T1Up, T1Vp, T1Wp, Tcn, T1Un, T1Vn, T1Wn are arranged (in FIG. 10, the side at the left edge of the substrate 150, provided that the position of the low-voltage battery 42 is defined as the upper side of the substrate 150), among the first upper and lower arm connection sections Tcp, T1Up, T1Vp, T1Wp, Tcn, T1Un, T1Vn, T1Wn, and the one side. In the first area, the first transformer terminals Ta1 of the first to fourth transformers 60, 62, 64, 66 and the low-voltage battery 42 are connected by the first wiring pattern L1.

The second transformer terminals Ta2 of the first to fifth transformers 60, 62, 64, 66, 68 are connected to each other by the second wiring pattern L2 (in FIG. 10, drawn by a broken line) provided on the substrate 150. Specifically, when viewing the first surface of the substrate 150 from the front thereof, the second wiring pattern L2 is formed so as to extend from the second transformer terminal Ta2 of the fifth transformer 68 to the second transformer terminals Ta2 of the first to fourth transformers 60, 62, 64, 66 through the second area and the first area. Note that, in the present embodiment, the first wiring pattern L1 and the second wiring pattern L2 correspond to a "first wiring section".

The first transformer terminals Ta1 of the sixth to ninth transformers 90, 92, 94, 96 are connected to each other by a third wiring pattern L3 (in FIG. 10, drawn by an alternate long and short dash line) provided on the substrate 150, and are connected to the low-voltage battery 42 by the third wiring pattern L3. Specifically, when viewing the first surface of the substrate 150 from the front thereof, the third wiring pattern L3 is formed so as to extend from the low-voltage battery 42 to the first transformer terminals Ta1 of the ninth transformer 96 through a third area and a fourth area. The third area is sandwiched between the second power supply control section CT2 and the sixth to eighth transformers 90, 92, 94 arrange in line, when viewing the first surface of the substrate 150 from the front thereof. The fourth area is, when viewing the first surface of the substrate 150 from the front thereof, sandwiched between the second W-phase upper and lower arm connection sections T2Wp, T2Wn, which are closest to one side of the substrate 150 positioned in the direction in which the second upper and lower arm connection sections T2Up, T2Vp, T2Wp, T2Un, T2Vn, T2Wn are arranged (in FIG. 10, the side at the right edge of the substrate 150), among the second upper and lower arm connection sections T2Up, T2Vp, T2Wp, T2Un, T2Vn, T2Wn, and the one side. In the third area, the first transformer terminals Ta1 of the sixth to eighth transformers 90, 92, 94 and the low-voltage battery 42 are connected by the third wiring pattern L3.

The second transformer terminals Ta2 of the sixth to ninth transformers 90, 92, 94, 96 are connected to each other by the fourth wiring pattern L4 (in FIG. 10, drawn by a broken line) provided on the substrate 150. Specifically, when viewing the first surface of the substrate 150 from the front thereof, the fourth wiring pattern L4 is formed so as to extend from the second transformer terminal Ta2 of the ninth transformer 96 to the second transformer terminals Ta2 of the sixth to eighth transformers 90, 92, 94 through the fourth area and the third area. Note that, in the present embodiment, the third wiring pattern L3 and the fourth wiring pattern L4 correspond to a "second wiring section".

Note that, in the present embodiment, the first wiring pattern L1, the second wiring pattern L2, and the first electric path Lfb1 are formed in different internal layers of the substrate 150. Hence, in FIG. 10, although there is a crossing section of the first wiring pattern L1, the second wiring pattern L2, and the first electric path Lfb1, the wiring patterns L1, L2 and the electric path Lfb1 are not electrically connected at this crossing section. The third wiring pattern L3, the fourth wiring pattern L4, and the second electric path Lfb2 are in the similar manner.

As described above, according to the present embodiment, the fifth transformer 68 (ninth transformer 96) common to the plurality of lower arm switching elements Scn, S1Un, S1Vn, S1Wn (S2Un, S2Vn, S2Wn) corresponding to the first power supply control section CT1 (second power supply control section CT2) is provided. In addition, the above technique is employed to arrange the first and second wiring patterns L1, L2 (third and fourth wiring patterns L3, L4) on the substrate 150. Hereinafter, a technical significance of providing the common transformer and that of the arrangement are described by taking the insulated power supply apparatus, in which the first power supply IC 52 is a main controller, as an example.

First, the technical significance of providing the common fifth transformer 68 is described.

By providing the common fifth transformer 68, the number of the lower arm transformers configuring the insulated power supply apparatus can be decreased. Hence, the wiring pattern connecting the primary side coil configuring the lower arm transformer and the low-voltage battery 42 can be shortened, and the number of the wiring patterns can be decreased. Hence, the first and second wiring patterns L1, L2, which can make small the loop including the low-voltage battery 42, the first wiring pattern L1, the primary side coils 60a, 62a, 64a, 66a, 68a, the second wiring pattern L2, the first voltage control switching element 80, and a portion having a reference potential of the low-voltage system (ground pattern of the substrate 150) and which can decrease the number of the loops, can be provided on the substrate 150. Hence, radiation noise due to switching of the first voltage control switching element 80 can be appropriately suppressed.

Figure 11:
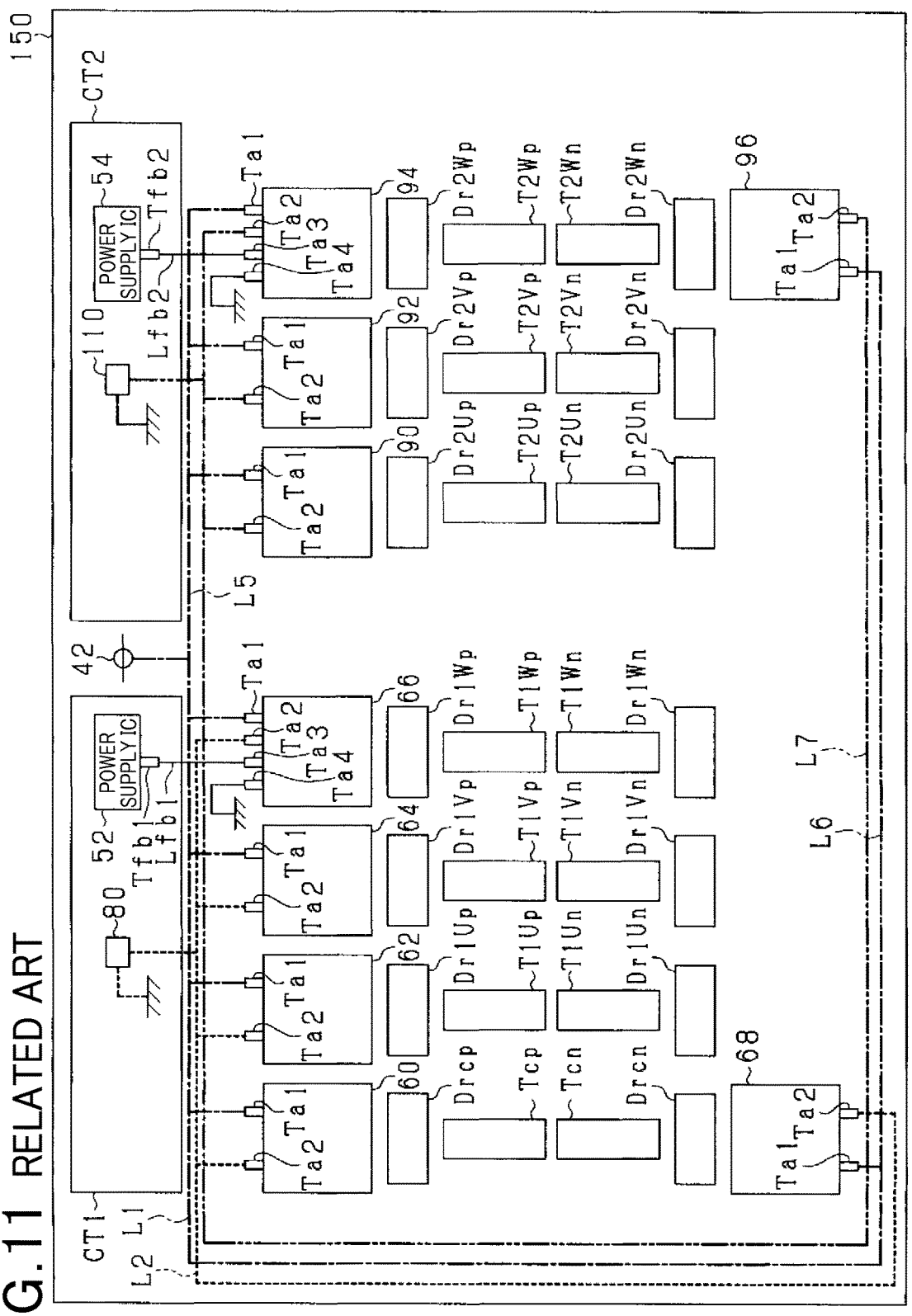
FIG. 11 is a diagram showing an insulated power supply apparatus according to a related art.

Next, technical significance of employing the technique of arrangement shown in FIG. 10 as the technique for arranging the first and second wiring patterns L1, L2 is described while compared with a related art shown in FIG. 11.

First, the related art is described with reference to FIG. 11. In FIG. 11, the same parts as those of FIG. 10 are denoted with the same reference numerals for the sake of convenience.

As shown FIG. 11, in the related art, the first transformer terminals Ta1 of the sixth to eighth transformers 90, 92, 94 are connected to each other by a fifth wiring pattern L5 (in FIG. 11, drawn by an alternate long and short dash line) passing through the third area sandwiched between the second power supply control section CT2 and the sixth to eighth transformers 90, 92, 94. In addition, the first transformer terminal Ta1 of the fifth transformer 68 and the first transformer terminal Ta1 of the ninth transformer 96 are connected by a sixth wiring pattern L6 (in FIG. 11, drawn by the alternate long and short dash line) passing through the fifth area. Note that, when viewing the first surface of the substrate 150 from the front thereof, the fifth area is an area opposed to the first and second lower arm connection sections Tcn, T1Un, T1Vn, T1Wn, T2Un, T2Vn, T2Wn with respect to the first and second lower arm drive circuits Drcn, Dr1Un, Dr1Vn, Dr1Wn, Dr2Un, Dr2Vn, Dr2Wn (that is, the fifth area is an area located with the first and second lower arm drive circuits Drcn, Dr1Un, Dr1Vn, Dr1Wn, Dr2Un, Dr2Vn, Dr2Wn between the area and the first and second lower arm connection sections Tcn, T1Un, T1Vn, T1Wn, T2Un, T2Vn, T2Wn).

In addition, the second transformer terminals Ta2 of the sixth to ninth transformers 90, 92, 94, 96 are connected to each other by a seventh wiring pattern L7 (in FIG. 11, drawn by an alternate long and two short dashes line) provided on the substrate 150. Specifically, when viewing the first surface of the substrate 150 from the front thereof, the seventh wiring pattern L7 is formed so as to extend from the second transformer terminal Ta2 of the ninth transformer 96 to the second transformer terminals Ta2 of the sixth to eighth transformers 90, 92, 94 through the fifth area, the second area, the first area, and the third area.

According to the above technique for arranging the wiring patterns, for example, the seventh wiring pattern L7 becomes longer, and the loop becomes larger, thereby increasing radiation noise.

To solve this problem, according to the technique of arrangement shown in FIG. 10, the wiring pattern can be shortened. Hence, radiation noise can be further suppressed.

According to the embodiment described above, the following advantages can be obtained.

(1) In the insulated power supply apparatus in which the first power supply IC 52 (second power supply IC 54) is used as a main controller, as shown in FIG. 10, a common transformer is provided which can supply drive voltage to the all the lower arm switching elements Scn, S1$n (S2$n). According to this configuration, the loop can be smaller, and the number of the loops can be decreased. Hence, radiation noise due to switching of the first voltage control switching element 80 (second voltage control switching element 110) can be appropriately suppressed.

Specifically, according to the present embodiment, since the lower arm transformer is a common transformer which can supply drive voltage to all the lower arm switching elements, the wiring pattern is further shortened, and the number of the wiring patterns is further decreased, thereby further suppressing radiation noise.

(2) The first and second wiring patterns L1, L2 are provided in the first and second areas. The third and fourth wiring patterns L3, L4 are provided in the third and fourth areas opposed to the first and second areas. Hence, shortening the wiring patterns can make the loop smaller, thereby further suppressing radiation noise.

Specifically, according to the present embodiment, providing the fifth transformer 68 in the vicinity of the step-up lower arm connection section Tcn and providing the ninth transformer 96 in the vicinity of the second W-phase lower arm connection section T2Wn can make the loop further smaller, thereby further suppressing radiation noise.

(3) The turn ratio of the fifth transformer 68 (ninth transformer 96) is set to be larger than those of the first to fourth transformers 60, 62, 64, 66 (sixth to eighth transformers 90, 92, 94). Hence, the variation of the output voltage of the first to fifth secondary side coils 60b, 62b, 64b, 66b, 68b (sixth to ninth secondary side coils 90b, 92b, 94b, 96b) can be smaller.

Second Embodiment

Hereinafter, the second embodiment is described focusing on differences from the first embodiment with reference to the drawing.

In the present embodiment, the position is changed where the second power supply control section CT2 is disposed on the substrate 150.

Figure 12:
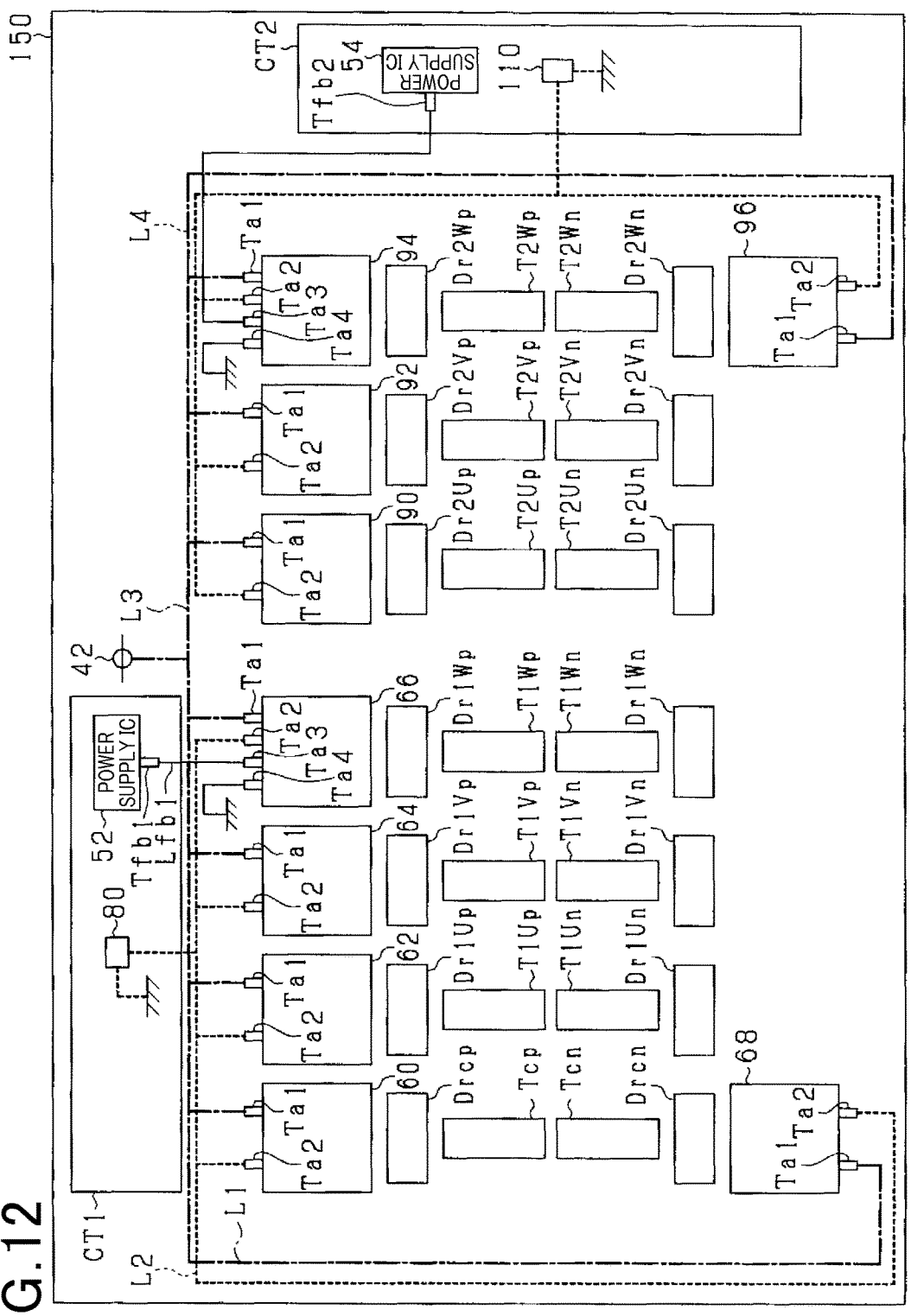
FIG. 12 is a plan view of a substrate according to a second embodiment.

FIG. 12 is a plan view of the substrate 150 according to the present embodiment. In FIG. 12, the same parts as those of FIG. 10 are denoted with the same reference numerals for the sake of convenience.

As shown in FIG. 12, when viewing the first surface of the substrate 150 from the front thereof, the second power supply control section CT2 is provided in an area sandwiched between the second W-phase upper and lower arm connection sections T2Wp, T2Wn, which are closest to one side of the substrate 150 positioned in the direction in which the second upper and lower arm connection sections T2Up, T2Vp, T2Wp, T2Un, T2Vn, T2Wn are arranged (in FIG. 12, the side at the right edge of the substrate 150), among the second upper and lower arm connection sections T2Up, T2Vp, T2Wp, T2Un, T2Vn, T2Wn, and the one side. In addition, the second power supply control section CT2 is provided on the substrate 150 so as to be adjacent to the eighth transformer 94 and the ninth transformer 96.

According to the above embodiment, advantages similar to those of the first embodiment can be obtained.

Third Embodiment

Hereinafter, the third embodiment is described focusing on differences from the second embodiment with reference to the drawing.

Figure 13:
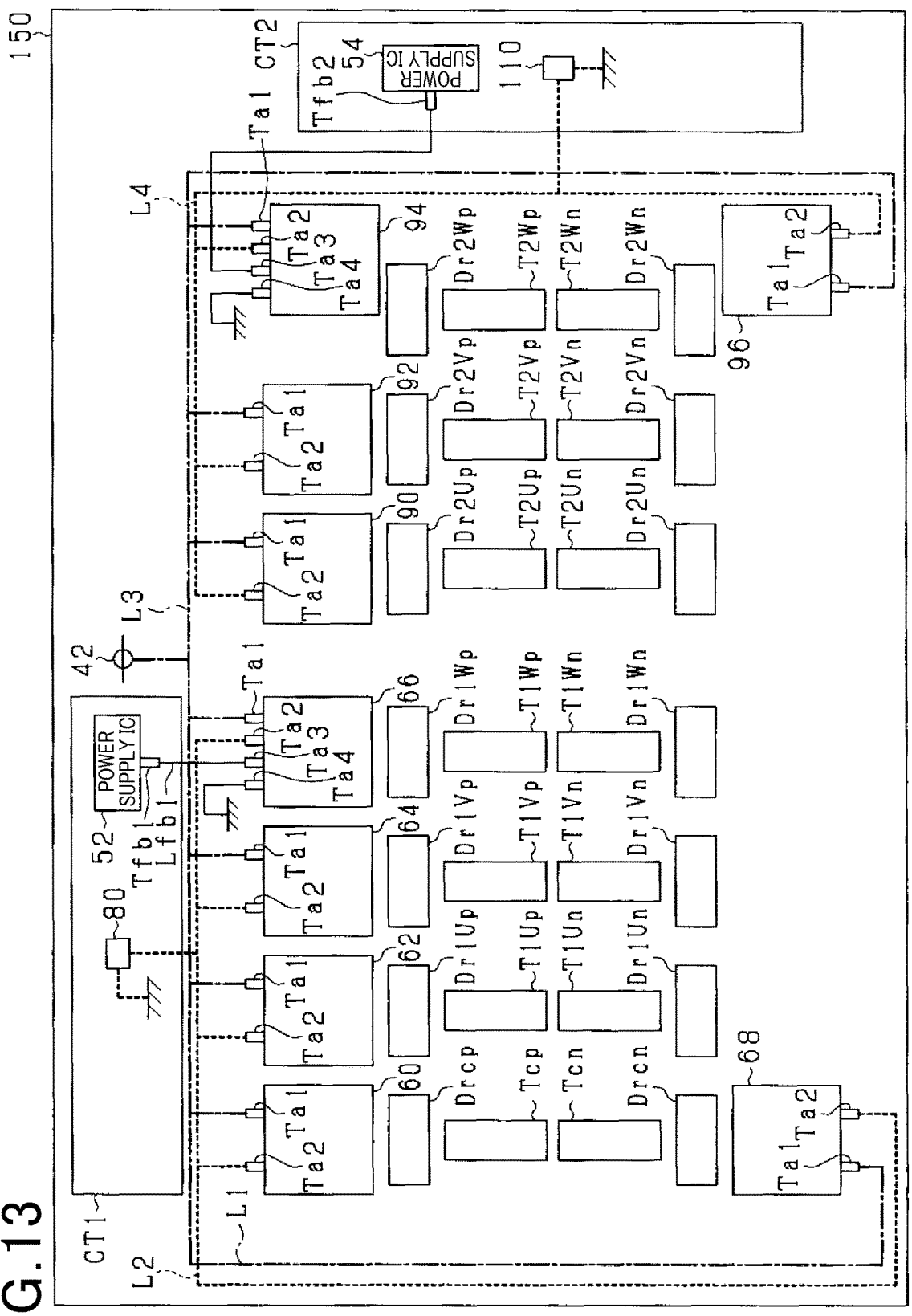
FIG. 13 is a plan view of a substrate according to a third embodiment

In the present embodiment, as shown in FIG. 13, the positions on the substrate 150 where the eighth transformer 94 and the ninth transformer 96 are disposed are close to the second power supply control section CT2. FIG. 13 is a plan view of the substrate 150 according to the present embodiment. In FIG. 13, the same parts as those of FIG. 12 are denoted with the same reference numerals for the sake of convenience.

According to the above embodiment, advantages similar to those of the first embodiment can be obtained.

Other Embodiments

It will be appreciated that the present invention is not limited to the configurations described above, but any and all modifications, variations or equivalents, which may occur to those who are skilled in the art, should be considered to fall within the scope of the present invention.

The "lower arm transformer" is not limited to the transformer common to the plurality of lower arm switching elements configuring the power converter circuit. For example, if taking as an example the plurality of lower arm switching elements Scn, S1Un, S1Vn, S1Wn corresponding to the first power supply control section CT1, the lower arm transformer may be a common transformer corresponding to the first U-, V-, W-phase lower arm switching elements S1Un, S1Vn, S1Wn. In this case, another lower arm transformer corresponding to the lower arm step-up switching element Scn is provided.

The way of connecting the primary side coils, the secondary side coils, wiring patterns formed on the substrate 150 and the like to the first to eighth transformer terminals Ta1 to Ta8 is not limited to those shown in FIGS. 10, 12 and 13. For example, the second wiring pattern L2 may be connected to the first transformer terminal Ta1, and the first wiring pattern L1 or the third wiring pattern L3 may be connected to the second transformer terminal Ta2.

In the above embodiments, the primary side coils configuring the upper arm transformer and the lower arm transformer may be directly connected.

The transformer, which feeds back the output voltage of the secondary side coil to the first power supply IC 52, is not limited to the fourth transformer 66, but may be, for example, any of the first to third and fifth transformers 60, 62, 64, 68. The second power supply IC 54 is in the similar manner.

When viewing the first surface of the substrate 150 from the front thereof, the orders, in which the upper arm connection sections Tcp, T1Up, T1Vp, T1Wp, T2Up, T2Vp, T2Wp are arranged and the lower arm connection sections Tcn, T1Un, T1Vn, T1Wn, T2Un, T2Vn, T2Wn are arranged, are not limited to those shown in FIG. 10.

When viewing the first surface of the substrate 150 shown in FIG. 12 or 13 from the front thereof, the second power supply control section CT2 may be provided in an area sandwiched between any one of the second W-phase upper arm connection section T2Wp and the second W-phase lower arm connection section T2Wn and the side at the right edge of the substrate 150 shown in FIG. 12 or 13.

In the above embodiments, the step-up converter 30 can be eliminated from the motor control system shown in FIG. 1.

The motor control system is not limited to a two-motor control system but may be a one-motor control system. In this case, one of the group of the first motor generator 10 and the first inverter 12 and the group of the second motor generator 20 and the second inverter 22, and the step-up converter 30 is eliminated from the motor control system shown in FIG. 1.

The "insulated power supply apparatus" is not limited to a flyback converter shown in FIG. 4 or 5, but may be, for example, a forward converter. In addition, the insulated power supply apparatus is not limited to the converter including one voltage control switching element but may be a full-bridge converter including four voltage control switching elements or a push-pull converter including two voltage control switching elements. Note that the full-bridge converter and the push-pull converter are disclosed in, for example, "Dengen Kairo Sekkei Seiko No Kagi, 4th Ed. by Seitaro Baba, CQ Publishing Co., Ltd, 2012, Feb. 1, 2012, p. 141".

The "power converter circuit" is not limited to a step-up converter and a three-phase inverter. For example, the power converter circuit may be another type of circuit such as a half-bridge circuit and a full-bridge circuit. In addition, the "upper arm switching element" and the "lower arm switching element" configuring the power converter circuit are not limited to IGBTs but may be MOSFETs.

Hereinafter, aspects of the above-described embodiments will be summarized.

As an aspect of the embodiment, an insulated power supply apparatus is provided, which is applied to at least one power converter circuit (12, 22, 30) including at least one series connection of an upper arm switching element (Scp, S1$p, S2$p) and a lower arm switching element (Scn, S1$n, S2$n). The power converter circuit includes a parallel connection of the series connection. The apparatus includes: at least one upper arm transformers (60, 62, 64, 66, 90, 92, 94) which has a primary side coil (60a, 62a, 64a, 66a, 90a, 92a, 94a) connectable to a DC power supply (42) and a secondary side coil (60b, 62b, 64b, 66b, 90b, 92b, 94b) which supplies drive voltage to the upper arm switching element, and which is provided on a substrate (150); a lower arm transformer (68, 96) which has a primary side coil (68a, 96a) connectable to the DC power supply and a secondary side coil (68b, 96b) which supplies drive voltage to the lower arm switching element, and which is provided on the substrate; at least one power supply control section (CT1, CT2) which has at least one voltage control switching element (80, 110) which is turned on or off to apply voltage of the DC power supply to the primary side coils of the upper arm transformer and the lower arm transformer, and an integrated circuit (52, 54) which turns on or off the voltage control switching element, and which is provided on the substrate; a wiring pattern (L1, L2, L3, L4) which is mounted on the substrate and connects the primary side coil configuring the lower arm transformer and the DC power supply; a plurality of upper arm connection sections (Tcp, T1Up, T1Vp, T1Wp, T2Up, T2Vp, T2Wp) which connect the upper arm switching elements to the substrate and which are provided on the substrate so as to be arranged in line, when viewing a surface of the substrate from a front thereof; and a plurality of lower arm connection sections (Tcn, T1Un, T1Vn, T1Wn, T2Un, T2Vn, T2Wn) which connect the lower arm switching elements to the substrate and which are provided on the substrate so as to be arranged in line and in a direction in which the upper arm connection sections are arranged, when viewing the surface of the substrate from the front thereof. The voltage control switching element is provided so as to form a closed circuit including the DC power supply, the primary side coils configuring the upper arm transformer and the lower arm transformer, the wiring pattern, and the voltage control switching element when being turned on. The upper arm connection sections arranged in line and the lower arm connection sections arranged in line are provided in parallel, when viewing the surface of the substrate from the front thereof. The upper arm transformer and the DC power supply are provided in an area opposed to the lower arm connection sections with respect to the upper arm connection sections, when viewing the surface of the substrate from the front thereof. When viewing the surface of the substrate from the front thereof, the power supply control section is provided in at least one of an area opposed to the upper arm connection sections with respect to the upper arm transformer and, an area which is sandwiched between at least one of the upper and lower connection sections closest to one side of the substrate positioned in a direction in which the upper arm connection sections are arranged, and the one side. The lower arm transformer is provided in an area opposed to the upper arm connection sections with respect to the lower arm connection sections, when viewing the surface of the substrate from the front thereof. The lower arm transformer is common to at least two of the lower arm switching elements.

According to the above embodiment, since the lower arm transformer serves as a common transformer which can supply drive voltage to at least one of the lower arm switching elements, the number of the lower arm transformers configuring the insulated power supply apparatus can be decreased. Hence, the wiring pattern connecting the primary side coil configuring the lower arm transformer and the DC power supply can be shortened, and the number of the wiring patterns can be decreased. Hence, wiring patterns, which make smaller the loop including the wiring patterns, the DC power supply, the voltage control switching elements, the primary side coils, and the ground of the insulated power supply apparatus and decrease the number of the loops, can be provided on the substrate. Hence, radiation noise due to switching of the voltage control switching element can be appropriately suppressed.

What is claimed is:

1. An insulated power supply apparatus, which is applied to at least one power converter circuit including a plurality of series connections of an upper arm switching element and a lower arm switching element, wherein the power converter circuit includes a parallel connection of the plurality of series connections, the apparatus comprises:

a plurality of upper arm transformers each of which has a primary side coil connectable to a DC power supply and a secondary side coil which supplies drive voltage to the upper arm switching element, and which is provided on a substrate;

a lower arm transformer which has a primary side coil connectable to the DC power supply and a secondary side coil which supplies drive voltage to the lower arm switching element, and which is provided on the substrate;

at least one power supply control section which has at least one voltage control switching element which is turned on or off to apply voltage of the DC power supply to the primary side coils of the upper arm transformers and the lower arm transformer, and an integrated circuit which turns on or off the voltage control switching element, and which is provided on the substrate;

a wiring pattern which is mounted on the substrate and connects the primary side coil configuring the lower arm transformer and the DC power supply;

a plurality of upper arm connection sections which connect the upper arm switching elements to the substrate and which are provided on the substrate so as to be arranged in line, when viewing a surface of the substrate from a front thereof; and a plurality of lower arm connection sections which connect the lower arm switching elements to the substrate and which are provided on the substrate so as to be arranged in line and in a direction in which the upper arm connection sections are arranged, when viewing the surface of the substrate from the front thereof, the voltage control switching element is provided so as to form a closed circuit including the DC power supply, the primary side coils configuring the upper arm transformers and the lower arm transformer, the wiring pattern, and the voltage control switching element when being turned on, the upper arm connection sections arranged in line and the lower arm connection sections arranged in line are provided in parallel, when viewing the surface of the substrate from the front thereof, the upper arm transformers and the DC power supply are provided in an area opposed to the lower arm connection sections with respect to the upper arm connection sections, when viewing the surface of the substrate from the front thereof, when viewing the surface of the substrate from the front thereof, the power supply control section is provided in at least one of an area opposed to the upper arm connection sections with respect to the upper arm transformers and, an area which is sandwiched between at least one of the upper and lower connection sections closest to one side of the substrate positioned in a direction in which the upper arm connection sections are arranged, and the one side, the lower arm transformer is provided in an area opposed to the upper arm connection sections with respect to the lower arm connection sections, when viewing the surface of the substrate from the front thereof, the lower arm transformer is common to at least two of the lower arm switching elements, and the upper arm transformers are provided so as to individually correspond to the upper arm switching elements.

2. The insulated power supply apparatus according to claim 1, wherein the lower arm transformer is common to all of the lower arm switching elements.

3. The insulated power supply apparatus according to claim 2, wherein the power supply control sections are a first power supply control section and a second power supply control section provided so as to individually correspond to two groups of the power converter circuits, the upper arm connection sections corresponding to the first power supply control section and the upper arm connection sections corresponding to the second power supply control section are provided in series, when viewing the surface of the substrate from the front thereof, the lower arm transformer corresponding to the first power supply control section is common to all the lower arm switching elements corresponding to the first power supply control section, the lower arm transformer corresponding to the second power supply control section is common to all the lower arm switching elements corresponding to the second power supply control section, the wiring pattern includes a first wiring section connecting the DC power supply and the primary side coil of the lower arm transformer corresponding to the first power supply control section and a second wiring section connecting the DC power supply and the primary side coil of the lower arm transformer corresponding to the second power supply control section, when viewing the surface of the substrate from the front thereof, the first wiring section connects the DC power supply and the primary side coil of the lower arm transformer through an area sandwiched between the upper arm connection section, which is closest to one side of the substrate positioned in the direction in which the upper arm connection sections are arranged, among the upper arm connection sections corresponding to the first power supply control section, and the one side, and when viewing the surface of the substrate from the front thereof, the second wiring section connects the DC power supply and the primary side coil of the lower arm transformer through an area sandwiched between the upper arm connection section, which is closest to one side of the substrate positioned in the direction in which the upper arm connection sections are arranged, among the upper arm connection sections corresponding to the second power supply control section, and the one side.

4. The insulated power supply apparatus according to claim 1, wherein when viewing the surface of the substrate from the front thereof, the lower arm transformer is provided in the vicinity of the lower arm connection section, which is closest to one side of the substrate positioned in the direction in which the lower arm connection sections are arranged, among the lower arm connection sections.

5. The insulated power supply apparatus according to claim 1, wherein the lower arm transformer is common to the lower arm switching elements, and a turn ratio of the secondary side coil to the primary side coil configuring the lower arm transformer is larger than a turn ratio of the secondary side coil to the primary side coil configuring the upper arm transformer.

6. The insulated power supply apparatus according to claim 1, wherein the primary side coils configuring the upper arm transformer and the lower arm transformer are connected in parallel.

* * * * *